United States Patent
Huska et al.

(10) Patent No.: US 10,354,895 B2
(45) Date of Patent: *Jul. 16, 2019

(54) SUPPORT SUBSTRATE FOR TRANSFER OF SEMICONDUCTOR DEVICES

(71) Applicant: Rohinni, LLC, Coeur d'Alene, ID (US)

(72) Inventors: Andrew Huska, Liberty Lake, WA (US); Cody Peterson, Hayden, ID (US); Clinton Adams, Coeur d'Alene, ID (US); Sean Kupcow, Greenacres, WA (US)

(73) Assignee: Rohinni, LLC, Coeur d'Alene, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/984,126

(22) Filed: May 18, 2018

(65) Prior Publication Data

US 2018/0269086 A1    Sep. 20, 2018

Related U.S. Application Data

(63) Continuation of application No. 15/409,409, filed on Jan. 18, 2017, now Pat. No. 10,062,588.

(51) Int. Cl.
*H01L 21/66* (2006.01)
*H01L 21/67* (2006.01)
(Continued)

(52) U.S. Cl.
CPC .. *H01L 21/67132* (2013.01); *H01L 21/67144* (2013.01); *H01L 21/67259* (2013.01);
(Continued)

(58) Field of Classification Search
CPC ......... H01L 21/67132; H01L 21/67144; H01L 21/67259; H01L 21/67265;
(Continued)

(56) References Cited

U.S. PATENT DOCUMENTS 3,887,996 A    6/1975    Hartleroad et al.
4,667,402 A    5/1987    Wilde
(Continued)

FOREIGN PATENT DOCUMENTS

EP    0375293 A2    6/1990
EP    2426398 A1    3/2012
(Continued)

OTHER PUBLICATIONS

The Chinese Office Action dated Oct. 9, 2018, for Chinese Patent Application No. 201580037905.9, a counterpart foreign applicaiton of U.S. Appl. No. 15/316,505, 9 Pages.
(Continued)

*Primary Examiner* — Sonya M Sengupta
(74) *Attorney, Agent, or Firm* — Lee & Hayes, P.C.

(57) ABSTRACT

An apparatus for transferring a semiconductor die from a wafer tape to a product substrate. The apparatus includes a wafer frame configured to secure the wafer tape and a support frame configured to secure a support substrate. The support substrate includes a plurality of holes and secures the product substrate. The apparatus further includes an actuator to transfer the semiconductor die to a transfer location on the product substrate.

15 Claims, 7 Drawing Sheets

(51) Int. Cl.
*H01L 21/68* (2006.01)
*H01L 23/00* (2006.01)
*H01L 33/62* (2010.01)
*H01L 21/677* (2006.01)
*H01L 21/687* (2006.01)
*H01L 23/544* (2006.01)
*H01L 25/075* (2006.01)

(52) U.S. Cl.
CPC .. *H01L 21/67265* (2013.01); *H01L 21/67778* (2013.01); *H01L 21/681* (2013.01); *H01L 21/68742* (2013.01); *H01L 25/0753* (2013.01); H01L 22/12 (2013.01); H01L 23/544 (2013.01); *H01L 24/83* (2013.01); *H01L 24/89* (2013.01); *H01L 33/62* (2013.01); *H01L 2221/68322* (2013.01); *H01L 2221/68327* (2013.01); *H01L 2221/68354* (2013.01); *H01L 2221/68363* (2013.01); *H01L 2221/68381* (2013.01); *H01L 2223/54413* (2013.01); *H01L 2223/54433* (2013.01); *H01L 2224/83224* (2013.01); *H01L 2924/12041* (2013.01); *H01L 2924/405* (2013.01); *H01L 2933/0066* (2013.01)

(58) Field of Classification Search
CPC ............. H01L 21/67778; H01L 21/681; H01L 21/68742; H01L 2221/68322; H01L 2221/68327; H01L 2221/68354; H01L 2221/68363; H01L 2221/68381; H01L 2223/54413; H01L 2223/54433; H01L 2224/83224; H01L 22/12; H01L 23/544; H01L 24/83; H01L 24/89; H01L 25/0753; H01L 2924/12041; H01L 2924/405; H01L 2933/0066; H01L 33/62; A61B 1/247
USPC ............... 156/391, 423, 443, 495, 496, 580; 359/855, 882; 433/30
See application file for complete search history.

(56) References Cited

U.S. PATENT DOCUMENTS

| | | |
|---|---|---|
| 4,859,267 A | 8/1989 | Knoll |
| 4,859,269 A | 8/1989 | Nishiguchi |
| 5,105,255 A | 4/1992 | Shannon et al. |
| 5,415,331 A | 5/1995 | Lin |
| 5,670,429 A | 9/1997 | Murayama |
| 5,951,918 A | 9/1999 | Kuwajima et al. |
| 5,976,912 A | 11/1999 | Fukutomi et al. |
| 6,002,180 A | 12/1999 | Akram et al. |
| 6,080,336 A | 6/2000 | Suehiro et al. |
| 6,085,573 A | 7/2000 | Larson |
| 6,091,332 A | 7/2000 | Eberhardt et al. |
| 6,171,736 B1 | 1/2001 | Hirayanagi |
| 6,173,750 B1 | 1/2001 | Davis et al. |
| 6,204,092 B1 | 3/2001 | Freund et al. |
| 6,207,473 B1 | 3/2001 | Hirai et al. |
| 6,228,676 B1 | 5/2001 | Glenn et al. |
| 6,238,597 B1 | 5/2001 | Yim et al. |
| 6,284,569 B1 | 9/2001 | Sheppard et al. |
| 6,284,998 B1 | 9/2001 | Sinkunas et al. |
| 6,319,754 B1 | 11/2001 | Wang et al. |
| 6,323,659 B1 | 11/2001 | Krahn |
| 6,352,073 B1 | 3/2002 | Kurosawa et al. |
| 6,353,202 B1 | 3/2002 | Grotsch et al. |
| 6,589,809 B1 | 7/2003 | Koopmans |
| 6,730,933 B1 | 5/2004 | Shimizu et al. |
| 6,770,961 B2 | 8/2004 | Lee |
| 6,889,427 B2 | 5/2005 | Yee et al. |
| 6,961,111 B1 | 11/2005 | Kuramasu |
| 7,060,593 B2 | 6/2006 | Kurosawa et al. |
| 7,102,524 B2 | 9/2006 | Arneson et al. |
| 7,192,843 B2 | 3/2007 | Kito |
| 7,279,346 B2 | 10/2007 | Andrews et al. |
| 7,279,347 B2 | 10/2007 | Hon et al. |
| 7,364,983 B2 | 4/2008 | Wang et al. |
| 7,445,688 B2 | 11/2008 | Suzuki et al. |
| 7,510,747 B2 | 3/2009 | Choi et al. |
| 7,560,303 B2 | 7/2009 | Wang et al. |
| 7,632,587 B2 | 12/2009 | McLean et al. |
| 7,637,714 B2 | 12/2009 | Kabeshita et al. |
| 7,795,076 B2 | 9/2010 | Arneson et al. |
| 7,857,569 B2 | 12/2010 | Hiroki et al. |
| 7,886,438 B2 | 2/2011 | Ito et al. |
| 7,906,787 B2 | 3/2011 | Kang |
| 8,034,647 B2 | 10/2011 | Batres et al. |
| 8,110,839 B2 | 2/2012 | Ing et al. |
| 8,136,231 B2 | 3/2012 | Schiller |
| 8,142,611 B2 | 3/2012 | Shibata et al. |
| 8,344,397 B2 | 1/2013 | Lerman et al. |
| 8,361,840 B2 | 1/2013 | Kerr et al. |
| 8,415,771 B1 | 4/2013 | Golda et al. |
| 8,415,879 B2 | 4/2013 | Lowenthal et al. |
| 8,791,530 B2 | 7/2014 | Bibl et al. |
| 8,794,501 B2 | 8/2014 | Bibl et al. |
| 8,835,940 B2 | 9/2014 | Hu et al. |
| 8,865,489 B2 | 10/2014 | Rogers et al. |
| 8,928,021 B1 | 1/2015 | Bibl et al. |
| 8,933,433 B2 | 1/2015 | Higginson et al. |
| 8,948,905 B2 | 2/2015 | Prakapenka et al. |
| 8,998,068 B2 | 4/2015 | Park et al. |
| 9,000,470 B2 | 4/2015 | Tudorica et al. |
| 9,000,566 B2 | 4/2015 | Golda et al. |
| 9,069,128 B2 | 6/2015 | Kuroda et al. |
| 9,082,936 B2 | 7/2015 | Baldridge et al. |
| 9,087,764 B2 | 7/2015 | Chan et al. |
| 9,099,568 B2 | 8/2015 | Blanchard |
| 9,105,714 B2 | 8/2015 | Hu et al. |
| 9,106,056 B1 | 8/2015 | Hersee |
| 9,136,161 B2 | 9/2015 | Bibl et al. |
| 9,142,535 B2 | 9/2015 | Oraw |
| 9,153,171 B2 | 10/2015 | Sakariya et al. |
| 9,159,707 B2 | 10/2015 | Cope |
| 9,166,114 B2 | 10/2015 | Hu et al. |
| 9,166,126 B2 | 10/2015 | Donofrio et al. |
| 9,217,541 B2 | 12/2015 | Bathurst et al. |
| 9,224,629 B2 | 12/2015 | Golda et al. |
| 9,229,597 B2 | 1/2016 | Oraw |
| 9,236,815 B2 | 1/2016 | Golda et al. |
| 9,255,001 B2 | 2/2016 | Golda et al. |
| 9,288,899 B2 | 3/2016 | Golda et al. |
| 9,296,111 B2 | 3/2016 | Bibl et al. |
| 9,308,649 B2 | 4/2016 | Golda et al. |
| 9,314,930 B2 | 4/2016 | Golda et al. |
| 9,318,475 B2 | 4/2016 | Bibl et al. |
| 9,324,692 B2 | 4/2016 | Lowenthal et al. |
| 9,324,693 B2 | 4/2016 | Oraw et al. |
| 9,368,549 B1 | 6/2016 | Oraw et al. |
| 9,370,864 B2 | 6/2016 | Bibl et al. |
| 9,379,092 B2 | 6/2016 | Hu et al. |
| 9,391,042 B2 | 7/2016 | Golda et al. |
| 9,418,979 B2 | 8/2016 | Karlicek, Jr. et al. |
| 9,425,151 B2 | 8/2016 | Golda et al. |
| 9,450,043 B2 | 9/2016 | Nuzzo et al. |
| 9,490,407 B2 | 11/2016 | Ray et al. |
| 9,508,694 B2 | 11/2016 | Oraw et al. |
| 9,570,427 B2 | 2/2017 | Bibl et al. |
| 9,583,466 B2 | 2/2017 | McGroddy et al. |
| 9,583,533 B2 | 2/2017 | Hu et al. |
| 9,595,638 B2 | 3/2017 | Ahn et al. |
| 9,666,764 B2 | 5/2017 | Bergmann et al. |
| 2001/0040620 A1 | 11/2001 | Wakisaka et al. |
| 2001/0047225 A1 | 11/2001 | Shimoike et al. |
| 2002/0043923 A1 | 4/2002 | Natori |
| 2002/0102760 A1 | 8/2002 | Gottfried |
| 2002/0149092 A1 | 10/2002 | Lee |
| 2003/0153099 A1 | 8/2003 | Jiang et al. |
| 2003/0230799 A1 | 12/2003 | Yee et al. |
| 2004/0020037 A1 | 2/2004 | Arneson et al. |
| 2004/0020039 A1 | 2/2004 | Arneson et al. |

(56) References Cited

U.S. PATENT DOCUMENTS

| | | |
|---|---|---|
| 2004/0020040 A1 | 2/2004 | Arneson et al. |
| 2004/0239861 A1 | 12/2004 | Uchida |
| 2004/0250417 A1 | 12/2004 | Arneson et al. |
| 2005/0007516 A1 | 1/2005 | Hong et al. |
| 2005/0009244 A1 | 1/2005 | Shiobara et al. |
| 2005/0015970 A1 | 1/2005 | Arneson et al. |
| 2005/0057906 A1 | 3/2005 | Nakatani et al. |
| 2005/0101052 A1 | 5/2005 | Kobayashi et al. |
| 2005/0115602 A1 | 6/2005 | Senta et al. |
| 2005/0155792 A1 | 7/2005 | Ito et al. |
| 2005/0253161 A1 | 11/2005 | Horio et al. |
| 2006/0002146 A1 | 1/2006 | Baba |
| 2006/0076690 A1 | 4/2006 | Khandros et al. |
| 2006/0145125 A1 | 7/2006 | Kuwajima et al. |
| 2006/0180344 A1 | 8/2006 | Ito et al. |
| 2006/0181600 A1 | 8/2006 | Bourdelais et al. |
| 2006/0225273 A1 | 10/2006 | Arneson et al. |
| 2007/0086211 A1 | 4/2007 | Beeson et al. |
| 2007/0095791 A1 | 5/2007 | Shinozaki et al. |
| 2007/0131016 A1 | 6/2007 | Addison et al. |
| 2007/0138494 A1 | 6/2007 | Pugh et al. |
| 2007/0152577 A1 | 7/2007 | Cho et al. |
| 2007/0164260 A1 | 7/2007 | Kuwajima |
| 2007/0171651 A1 | 7/2007 | Park et al. |
| 2007/0263190 A1 | 11/2007 | De Boeij et al. |
| 2008/0005895 A1 | 1/2008 | Aoyama et al. |
| 2008/0032484 A1 | 2/2008 | Diep et al. |
| 2008/0060750 A1 | 3/2008 | Wang et al. |
| 2008/0118681 A1 | 5/2008 | Ueno |
| 2008/0124842 A1 | 5/2008 | Wang et al. |
| 2008/0145968 A1 | 6/2008 | Hiew et al. |
| 2008/0185972 A1 | 8/2008 | Ito |
| 2008/0267745 A1 | 10/2008 | Schiller |
| 2009/0030312 A1 | 1/2009 | Hadjicostis |
| 2009/0032295 A1 | 2/2009 | Okajima et al. |
| 2009/0039376 A1 | 2/2009 | Uemoto et al. |
| 2009/0065588 A1 | 3/2009 | Aoki et al. |
| 2009/0090468 A1 | 4/2009 | Murayama |
| 2009/0095963 A1 | 4/2009 | Daniels |
| 2009/0096413 A1 | 4/2009 | Partovi et al. |
| 2009/0217522 A1 | 9/2009 | Ito et al. |
| 2009/0283220 A1 | 11/2009 | Chen |
| 2010/0044845 A1 | 2/2010 | Funaya et al. |
| 2010/0073597 A1 | 3/2010 | Bierhuizen et al. |
| 2010/0075459 A1 | 3/2010 | Kerr et al. |
| 2010/0200898 A1 | 8/2010 | Lin et al. |
| 2010/0246152 A1 | 9/2010 | Lin et al. |
| 2011/0034912 A1 | 2/2011 | de Graff et al. |
| 2011/0089443 A1 | 4/2011 | Hsu |
| 2011/0120761 A1 | 5/2011 | Kawai |
| 2011/0123796 A1 | 5/2011 | Auman et al. |
| 2011/0175518 A1 | 7/2011 | Reed et al. |
| 2011/0180137 A1 | 7/2011 | Iwamuro et al. |
| 2011/0180138 A1 | 7/2011 | Adachi et al. |
| 2011/0209751 A1 | 9/2011 | Nojiri et al. |
| 2011/0232082 A1 | 9/2011 | Kim et al. |
| 2011/0277831 A1 | 11/2011 | Yoshida et al. |
| 2011/0315956 A1 | 12/2011 | Tischler et al. |
| 2011/0317417 A1 | 12/2011 | Gourlay |
| 2012/0049204 A1 | 3/2012 | Lai |
| 2012/0070570 A1 | 3/2012 | Kim et al. |
| 2012/0156814 A1 | 6/2012 | Hsieh et al. |
| 2012/0157804 A1 | 6/2012 | Rogers et al. |
| 2012/0165759 A1 | 6/2012 | Rogers et al. |
| 2012/0193662 A1 | 8/2012 | Donofrio et al. |
| 2012/0224111 A1 | 9/2012 | Ohshima |
| 2012/0247817 A1 | 10/2012 | Hommura et al. |
| 2012/0292086 A1 | 11/2012 | Auman et al. |
| 2012/0320581 A1 | 12/2012 | Rogers et al. |
| 2013/0037838 A1 | 2/2013 | Speier et al. |
| 2013/0041235 A1 | 2/2013 | Rogers et al. |
| 2013/0056749 A1 | 3/2013 | Tischler et al. |
| 2013/0062637 A1 | 3/2013 | Reed et al. |
| 2013/0119538 A1 | 5/2013 | McCarthy |
| 2013/0208026 A1 | 8/2013 | Suzuki et al. |
| 2013/0264592 A1 | 10/2013 | Bergmann et al. |
| 2013/0271959 A1 | 10/2013 | Woodgate et al. |
| 2013/0294006 A1 | 11/2013 | Kang et al. |
| 2013/0309792 A1 | 11/2013 | Tischler et al. |
| 2014/0062316 A1 | 3/2014 | Tischler et al. |
| 2014/0065741 A1 | 3/2014 | Chern et al. |
| 2014/0071413 A1 | 3/2014 | Takakuwa |
| 2014/0091337 A1 | 4/2014 | Ooyabu et al. |
| 2014/0094878 A1 | 4/2014 | Gossler et al. |
| 2014/0098557 A1 | 4/2014 | Veerasamy |
| 2014/0104850 A1 | 4/2014 | Yamamoto et al. |
| 2014/0110859 A1 | 4/2014 | Rafferty et al. |
| 2014/0130340 A1 | 5/2014 | Li et al. |
| 2014/0159072 A1 | 6/2014 | Ooyabu et al. |
| 2014/0167611 A1 | 6/2014 | Tischler et al. |
| 2014/0199635 A1 | 7/2014 | Hirano et al. |
| 2014/0264407 A1 | 9/2014 | Tischler et al. |
| 2014/0303452 A1 | 10/2014 | Ghaffari |
| 2014/0339495 A1 | 11/2014 | Bibl et al. |
| 2014/0355251 A1 | 12/2014 | Kahrs et al. |
| 2014/0367711 A1 | 12/2014 | Bibl et al. |
| 2015/0023023 A1 | 1/2015 | Livesay et al. |
| 2015/0034989 A1 | 2/2015 | Namiki et al. |
| 2015/0037517 A1 | 2/2015 | Buriak et al. |
| 2015/0054003 A1 | 2/2015 | Oraw |
| 2015/0204490 A1 | 7/2015 | Zheng et al. |
| 2015/0262729 A1 | 9/2015 | Aoki et al. |
| 2015/0303359 A1 | 10/2015 | Liu et al. |
| 2015/0308632 A1 | 10/2015 | Ueno et al. |
| 2015/0332635 A1 | 11/2015 | Lau et al. |
| 2015/0364633 A1 | 12/2015 | Hosomi et al. |
| 2015/0370130 A1 | 12/2015 | Lin |
| 2015/0371585 A1 | 12/2015 | Bower et al. |
| 2016/0026846 A1 | 1/2016 | Lin et al. |
| 2016/0066789 A1 | 3/2016 | Rogers et al. |
| 2016/0172562 A1 | 6/2016 | Voutsas |
| 2016/0211415 A1 | 7/2016 | Huang et al. |
| 2016/0218264 A1 | 7/2016 | Tischler et al. |
| 2016/0233269 A1 | 8/2016 | Choi et al. |
| 2016/0267836 A1 | 9/2016 | Meersman et al. |
| 2016/0275205 A1 | 9/2016 | Lehavi et al. |
| 2016/0276195 A1 | 9/2016 | Huska et al. |
| 2016/0276205 A1 | 9/2016 | Huska et al. |
| 2017/0005077 A1 | 1/2017 | Kim et al. |
| 2017/0053901 A1 | 2/2017 | Huska et al. |
| 2017/0062400 A1 | 3/2017 | Li et al. |
| 2017/0062683 A1 | 3/2017 | Chen et al. |
| 2017/0140959 A1 | 5/2017 | Huska et al. |
| 2017/0140967 A1 | 5/2017 | Huska et al. |
| 2017/0150602 A1 | 5/2017 | Johnston et al. |
| 2017/0188427 A1 | 6/2017 | Cok et al. |
| 2017/0194171 A1 | 7/2017 | Peterson et al. |
| 2017/0256523 A1 | 9/2017 | Huska et al. |
| 2017/0256524 A1 | 9/2017 | Huska et al. |
| 2017/0269430 A1 | 9/2017 | Peterson et al. |
| 2017/0365586 A1 | 12/2017 | Huska et al. |
| 2018/0053752 A1 | 2/2018 | Huska et al. |
| 2018/0122673 A1 | 5/2018 | Wendt et al. |
| 2018/0141163 A1 | 5/2018 | Wendt et al. |
| 2018/0204749 A1 | 7/2018 | Huska et al. |
| 2018/0233495 A1 | 8/2018 | Peterson et al. |
| 2018/0248090 A1 | 8/2018 | Huska et al. |
| 2018/0261579 A1 | 9/2018 | Huska et al. |
| 2018/0261580 A1 | 9/2018 | Huska et al. |
| 2018/0261581 A1 | 9/2018 | Huska et al. |
| 2018/0286838 A1 | 10/2018 | Huska et al. |
| 2018/0301439 A1 | 10/2018 | Peterson et al. |

FOREIGN PATENT DOCUMENTS

| | | |
|---|---|---|
| JP | 10294493 | 11/1998 |
| JP | 2009101762 | 5/2009 |
| JP | WO2011111293 | 6/2013 |
| RU | 2331951 C1 | 8/2008 |
| WO | WO2012148231 A2 | 11/2002 |
| WO | WO2007011068 A1 | 1/2007 |
| WO | WO2016069766 A1 | 5/2016 |
| WO | WO2016154956 A1 | 10/2016 |
| WO | WO2016183844 A1 | 11/2016 |

(56) References Cited

FOREIGN PATENT DOCUMENTS

| WO | WO2016183845 A1 | 11/2016 |
| WO | WO2017008253 A1 | 1/2017 |
| WO | WO2017028206 A1 | 2/2017 |
| WO | WO2017028207 A1 | 2/2017 |
| WO | WO2008012460 A2 | 1/2018 |

OTHER PUBLICATIONS

The Korean Office Action dated Nov. 26, 2018 for Korean Patent Application No. 10-2017-7000398, a counterpart of U.S. Appl. No. 15/316,505, 20 pages.

Office Action for U.S. Appl. No. 15/444,013, dated Oct. 4, 2018, Huska et al, "Semiconductor Device Circuit Apparatus Bonded with Anisotropic Conductive Film and Method of Direct Transfer for Making the Same", 15 pages.

Office Action for U.S. Appl. No. 15/316,505, dated Nov. 16, 2018, Peterson et al, "Manufacture of Circuit Assembly with Unpackaged Semiconductor Devices", 22 pages.

Non Final Office Action dated Dec. 5, 2018 for U.S. Appl. No. 15/978,091 "Apparatus for Improved Direct Transfer of Semiconductor Die" Huska, 16 pages.

The Extended European Search Report dated Sep. 19, 2018 for European Application No. 16769455.3, 9 pages.

The Korean Office Action dated Jul. 2, 2018, for the Korean Patent Application No. 10-2017-7026529, a counterpart foreign application of U.S. Pat. No. 9,633,883, 5 pages.

Office Action for U.S. Appl. No. 15/951,094, dated Oct. 11, 2018, Peterson et al., "Substrate With Array of LEDs for Backlighting a Display Device", 13 pages.

Office Action for U.S. Appl. No. 16/013,755, dated Oct. 25, 2018, Peterson et al, "Substrate with Array of LEDs for Backlighting a Display Device", 12 pages.

Office Action for U.S. Appl. No. 15,978,092, dated Aug. 30, 2018, Andrew Huska, "Apparatus for Direct Transfer of Semiconductor Devices With Needle Retraction Support", 14 pages.

"Capillaries 1572& 1572N Series," Gaisef precision bonding tools, coorstek.com, Nov. 23, 2016, 1 page.

The Extended European Search Report dated Feb. 12, 2018 for European Patent Application No. 15803526.1, 6 pages.

Office Action for U.S. Appl. No. 14/939,896, dated Jul. 5, 2016, Huska et al., "Method and Apparatus for Transfer of Semiconductor Devices," 9 pages.

Office Action for U.S. Appl. No. 15/074,994, dated Oct. 3, 2016, Huska et al., "Method for Transfer of Semiconductor Devices", 10 pages.

Office Action for U.S. Appl. No. 15/409,409, dated Oct. 5, 2017, Huska et al., "Flexible Support Substrate for Transfer of Semiconductor Devices", 10 pages.

Office Action for U.S. Appl. No. 15/345,425, dated Nov. 21, 2017, Huska et al., "Substrate With Array of LEDs for Backlighting a Display Device," 14 pages.

Office Action for U.S. Appl. No. 15/444,013, dated Mar. 22, 2018, Huska et al., "Semiconductor Device Circuit Apparatus Bonded with Anisotropic Conductive Film and Method of Direct Transfer for Making the Same," 16 pages.

Office Action for U.S. Appl. No. 15/479,063, dated Apr. 19, 2018, Peterson, "Method and Apparatus for Light Diffusion," 12 pages.

Office Action for U.S. Appl. No. 15/345,425, dated Aug. 11, 2017, Huska et al., "Substrate With Array of LEDs for Backlighting a Display Device," 12 pages.

Office Action for U.S. Appl. No. 15/075,001, dated Aug. 18, 2016, Peterson et al., "Method and Apparatus for Light Diffusion," 13 pages.

Office Action for U.S. Appl. No. 15/479,063, dated Sep. 11, 2017, Peterson, "Method and Apparatus for Light Diffusion," 11 pages.

Office Action for U.S. Appl. No. 15/444,013, dated Sep. 20, 2017, Huska et al., "Semiconductor Device Circuit Apparatus Bonded with Anisotropic Conductive Film and Method of Direct Transfer for Making the Same," 36 pages.

The PCT Search Report and Written Opinion dated Dec. 10, 2015 for PCT application No. PCT/US2015/034596, 9 pages.

The PCT Search Report and Written Opinion dated Mar. 15, 2018 for PCT application No. PCT/US2017/062968, 7 pages.

PCT Search Report and Written Opinion dated Apr. 12, 2018 for PCT Application No. PCT/US17/62981, 7 pages.

The PCT Search Report and Written Opinion dated Jun. 2, 2016 for PCT application No. PCT/US2016/023280, 7 pages.

PCT Search Report and Written Opinion dated Aug. 14, 2017 for PCT Application No. PCT/US17/23061, 10 pages.

The PCT Search Report and Written Opinion dated May 10, 2018 for PCT application No. PCT/US2018/014256, 7 pages.

PCT Search Report and Written Opinion dated May 4, 2018 for PCT Application No. PCT/US18/19773, 7 pages.

US 10,354,895 B2

SUPPORT SUBSTRATE FOR TRANSFER OF SEMICONDUCTOR DEVICES

CROSS REFERENCE TO RELATED PATENT APPLICATIONS

This application is a continuation of and claims priority to U.S. patent application Ser. No. 15/409,409, filed Jan. 18, 2017, entitled "Flexible Support Substrate for Transfer of Semiconductor Devices," the entirety of which is herein incorporated by reference. This application also incorporates by reference, in its entirety, U.S. patent application Ser. No. 14/939,896, filed on Nov. 12, 2015, entitled "Apparatus for Transfer of Semiconductor Devices," which is now patented as U.S. Pat. No. 9,633,883.

BACKGROUND

Semiconductor devices are electrical components that utilize semiconductor material, such as silicon, germanium, gallium arsenide, and the like. Semiconductor devices are typically manufactured as single discrete devices or as integrated circuits (ICs). Examples of single discrete devices include electrically-actuatable elements such as light-emitting diodes (LEDs), diodes, transistors, resistors, capacitors, fuses, etc.

The fabrication of semiconductor devices typically involves an intricate manufacturing process with a myriad of steps. The end-product of the fabrication is a "packaged" semiconductor device. The "packaged" modifier refers to the enclosure and protective features built into the final product as well as the interface that enables the device in the package to be incorporated into a product circuit.

The conventional fabrication process for semiconductor devices starts with handling a semiconductor wafer. The wafer is diced into a multitude of "unpackaged" semiconductor devices. The "unpackaged" modifier refers to an unenclosed semiconductor device without protective features. Herein, unpackaged semiconductor devices may be called semiconductor device die, or just "die" for simplicity. A single semiconductor wafer may be diced to create die of various sizes, so as to form upwards of more than 100,000 or even 1,000,000 die from the semiconductor wafer (depending on the starting size of the semiconductor), and each die has a certain quality. The unpackaged die are then "packaged" via a conventional fabrication process discussed briefly below. The actions between the wafer handling and the packaging may be referred to as "die preparation."

In some instances, the die preparation may include sorting the die via a "pick and place process," whereby diced die are individually picked up and sorted into bins. The sorting may be based on the forward voltage capacity of the die, the average power of the die, and/or the wavelength of the die.

Typically, the packaging involves mounting a die onto a plastic or ceramic package (e.g., mold or enclosure). Packaging may also include connecting the die contacts to pins/wires for interfacing/interconnecting with product circuitry. The packaging of the semiconductor device is typically completed by sealing the die to protect it from the environment (e.g., dust).

After packaging, a product manufacturer then places packaged semiconductor devices in product circuitry. Due to the packaging, the devices are ready to be "plugged in" to the circuit assembly of the product being manufactured. Additionally, while the packaging of the devices protects them from elements that might degrade or destroy the devices, the packaged devices are inherently larger (e.g., in some cases, around 10 times the thickness and 10 times the area, resulting in 100 times the volume) than the die found inside the package. Thus, the resulting circuit assembly cannot be any thinner than the packaging of the semiconductor devices.

When mounting an unpackaged die onto product circuitry, significant forces may be exerted on the body of the unpackaged die. Due to the properties and characteristics of unpackaged die or the package being used, these exerted forces may cause damage to the unpackaged die being transferred, the circuit substrate, and/or contacts (circuit trace) electrically linking the unpackaged die. Such damage may ultimately lead to failure of the product.

BRIEF DESCRIPTION OF THE DRAWINGS

The Detailed Description is set forth with reference to the accompanying figures. In the figures, the left-most digit(s) of a reference number identifies the figure in which the reference number first appears. The use of the same reference numbers in different figures indicates similar or identical items. Furthermore, the drawings may be considered as providing an approximate depiction of the relative sizes of the individual components within individual figures. However, the drawings are not to scale, and the relative sizes of the individual components, both within individual figures and between the different figures, may vary from what is depicted. In particular, some of the figures may depict components as a certain size or shape, while other figures may depict the same components on a larger scale or differently shaped for the sake of clarity.

DETAILED DESCRIPTION

Figure 1:
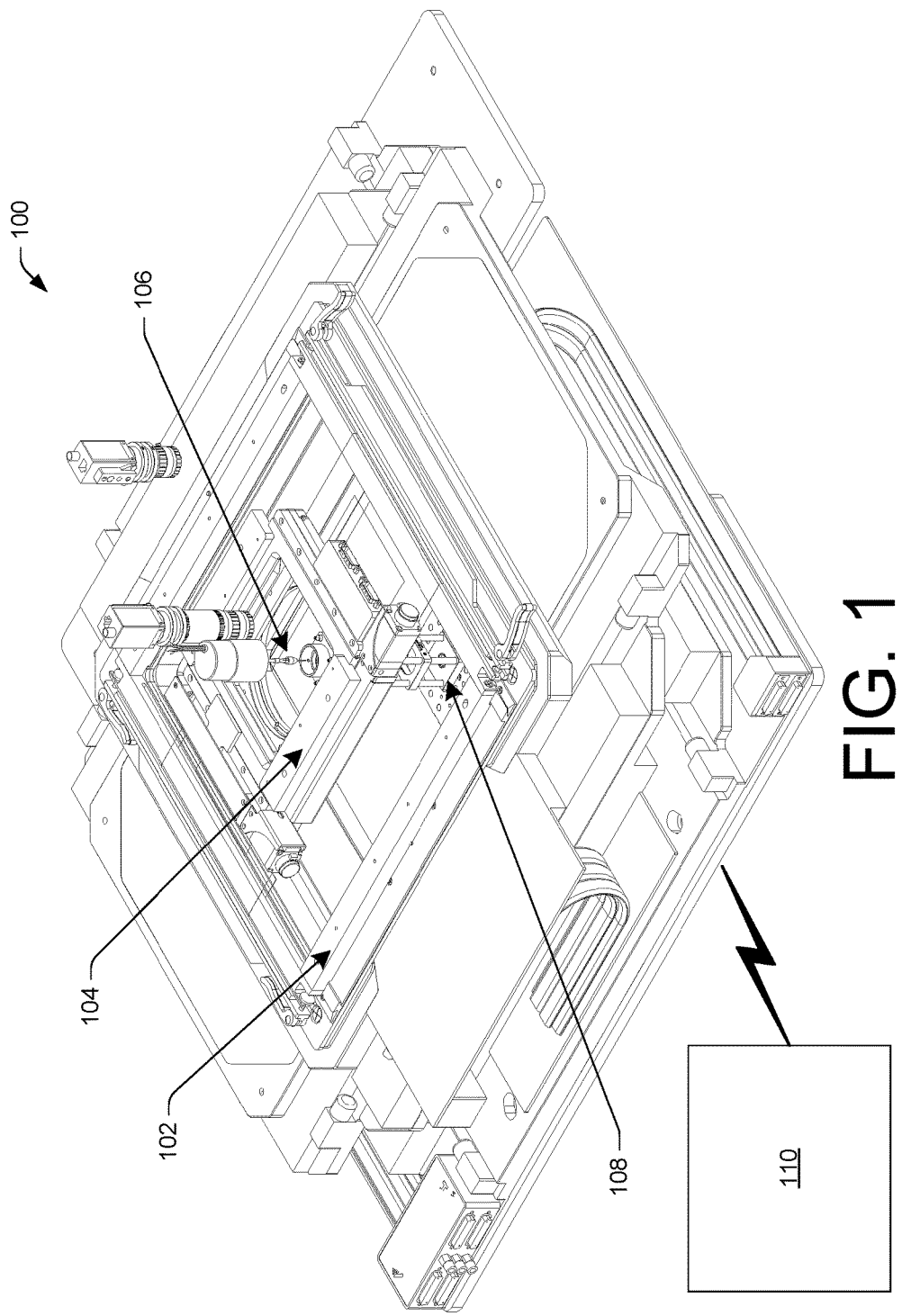
FIG. 1 illustrates an isometric view of an embodiment of a transfer apparatus.

This disclosure is directed generally to a machine that directly transfers and affixes semiconductor device die to a circuit and to the process for achieving the same, as well as to the circuit having die affixed thereto (as the output product). In some instances, the machine functions to transfer unpackaged die directly from a substrate such as a "wafer tape" to a product substrate, such as a circuit substrate. The product substrate may be secured to or otherwise supported by a flexible support substrate. The flexible support substrate may serve to dampen, through deflection or other means, forces associated with the transfer process. Since the direct transfer of unpackaged die (hereinafter "die") may significantly reduce the thickness of an end product compared to a similar product produced by conventional means using conventional packaged die, as well as the amount of time and/or cost to manufacture the product substrate, it is advantageous to make the transfer process run as smoothly as is possible.

For the purpose of this description, the term "substrate" refers to any substance on which, or to which, a process or action occurs. Further, the term "product" refers to the desired output from a process or action, regardless of the state of completion. Thus, a product substrate refers to any substance on which, or to which, a process or action is caused to occur for a desired output. Likewise, a support substrate refers to any suitable substance for supporting a product substrate, as discussed further herein below.

In an embodiment, the machine may secure a support substrate. The support substrate may be configured to assist in the transfer process, for instance, through dampening forces exerted by the machine during the transfer of die. Through dampening these forces, the support substrate may reduce stress, strain, and/or other forces being imparted to the die and/or product substrate.

Prior to transferring a die, a product substrate is secured to the support substrate. The product substrate is configured to receive die, such as LEDs, being transferred from the wafer tape, for example. To ensure an accurate die transfer, the product substrate is adequately secured to support substrate such that product substrate does not reposition or shift during the process of transferring die to product substrate.

The product substrate may be secured to the support substrate via any suitable means. For example, the product substrate may be secured via adhesive means, such as a resin or glue, tape, or a releasable tacky material. Additionally, and/or alternatively, the product substrate may be secured via a system of holes in the support substrate that align with respective protrusions on the product substrate to hold the product substrate in place. Moreover, the product substrate may be secured using mechanical fasteners.

In general, the unpackaged die to be transferred are very small and thin. For example, a die may be about 50 microns thick or less. Due to the relatively small size of the die, the machine includes components that function to precisely align both the wafer tape carrying the die and the product substrate, so as to ensure accurate placement and/or avoid product material waste. This alignment generally also includes aligning the die with a circuit trace on the product substrate. Due to the interaction between the product substrate and the support substrate, as referred to herein, alignment of the product substrate is accomplished by maneuvering or positioning the support substrate when supporting the product substrate.

In an embodiment, the components that align the product substrate and the die on the wafer tape may include a set of frames in which the wafer tape and the support substrate are secured respectively and conveyed individually to a position of alignment such that a specific die on the wafer tape is transferred to a specific spot on the product substrate. That is, as alluded to previously, the product substrate may be aligned into position through movement of the frame holding the support substrate.

The frame that conveys the support substrate may travel in various directions, including horizontal directions and/or vertical directions, or even directions that would permit transfer to a curved surface. For instance, the frame may rotate. The frame that conveys the wafer tape may also travel in various directions. A system of gears, tracks, motors, and/or other elements may be used to secure and convey the frames carrying the support substrate and the wafer tape respectively to align the product substrate with the wafer tape in order to place a die on the correct position of the product substrate. Each frame system may also be moved to an extraction position in order to facilitate extraction of the wafer tape, the support substrate, and/or the product substrate upon completion of the transfer process.

The machine may further include a transfer mechanism for transferring the die directly from the wafer tape to the product substrate without "packaging" the die. The transfer mechanism may be disposed vertically above the wafer tape so as to press down on the die via the wafer tape toward the product substrate. The process of pressing down on the die may cause the die to peel off the wafer tape, starting at the sides of the die until the die separate from the wafer tape to be attached to the product substrate. That is, by reducing the adhesion force between the die and the wafer tape, and increasing the adhesion force between the die and the product substrate, the die may be transferred to the product substrate.

In some embodiments, the transfer mechanism may include a transfer element. In an embodiment, the transfer element may include an elongated rod, such as a pin or needle that may be cyclically actuated against the wafer tape to push the wafer tape from a top side. The transfer element head may be sized so as to be no wider than a width of the die being transferred. Alternatively, the width of the transfer element head may be wider than a width of a die being transferred. Further, the transfer element may be sized to transfer multiple die at the same time or during a single press or cycle thereof. When the end of the transfer element contacts the wafer tape, the wafer tape may experience a local deflection at the area between the die and the wafer tape. Inasmuch as the deflection is highly localized and rapidly performed, the portion of the wafer tape that does not receive pressure from the transfer element may begin to flex away from the surface of the die. This partial separation may thus cause the die to lose sufficient contact with the wafer tape, so as to release from the wafer tape and transfer to the product substrate. Moreover, in some instances, the deflection of the wafer tape may be so minimal, as to maintain an entirety of the surface area of the die in contact with the wafer tape, while still causing the opposing surface of the die to extend beyond a plane of extension of the corresponding surface of the adjacent die, thereby allowing the target die to be transferred by connection to the circuit trace and being fixed thereto, while avoiding an unintentional transfer of the adjacent die. Note, for the purposes of simplicity, the transfer element may be referred to hereinafter as "the needle."

As previously mentioned, the support substrate is flexible and supports the product substrate such that forces exerted by the transfer mechanism against the die and/or the product substrate during a transfer process may be dampened. Thus, when die are transferred to the product substrate, the support substrate may deflect, in response to the press of the transfer mechanism, such that the effect of the transfer force is minimized on the die and/or the product substrate. Therefore, the effect of dampening by the support substrate may prevent the die(s) and/or product substrate from breaking or being otherwise damaged.

The machine may further include a fixing mechanism for affixing the separated die to the product substrate. In some instances, and as mentioned, the product substrate may have thereon a circuit trace to which the die are transferred and affixed. The fixing mechanism may include a device that emits energy, such as a laser, to melt/soften the material of the circuit trace on the product substrate. Additionally, the energy-emitting device may melt/soften material of the product substrate to form a further bond between the product substrate and the die.

Considering the effect of the energy-emitting device used, a particular support substrate may be chosen so as to avoid being melted or becoming deformed during a transfer. For example, when using a laser as the energy-emitting device 236, the chosen material of the support substrate may have characteristics that permit a particular wavelength of light used in the laser to pass therethrough, such that the energy applied from the laser does not affect the support substrate. More particularly, a support substrate of a predetermined material may be unaffected by a certain wavelength of light that is used to melt, soften, or otherwise prepare circuit trace and/or product substrate for receiving die. However, in other embodiments, the wavelength may be chosen to have an effect on all or some of the circuit trace, product substrate, and support substrate. For instance, in an embodiment, the product substrate may be secured to the support substrate though the energy-emitting device.

In another example embodiment, the support substrate may include a plurality of holes therethrough that provide an opening for the energy emitted from the fixing mechanism to pass through the support substrate to directly reach the product substrate. The support substrate may have a predetermined pattern of hole locations according to the circuit trace pattern and/or die placement on the product substrate. Moreover, a variety of support substrates may be created to form templates for various product substrates having different die placements.

First Example Embodiment of a Direct Transfer Apparatus

FIG. 1 illustrates an embodiment of an apparatus 100 that may be used to directly transfer unpackaged semiconductor components (or "die") from a wafer tape to a product substrate. The wafer tape may also be referred to herein as the semiconductor device die substrate, or simply a die substrate. Apparatus 100 may include a support substrate conveyance mechanism 102 and a wafer tape conveyance mechanism 104. Located on the support substrate, a product substrate may be positioned to receive the die being transferred from the wafer tape. Each of support substrate conveyance mechanism 102 and wafer tape conveyance mechanism 104 may include a movable frame system to desired alignment positions with respect to each other.

Apparatus 100 may further include a transfer mechanism 106, which, as shown, may be disposed vertically above wafer tape conveyance mechanism 104. In some instances, transfer mechanism 106 may be positioned so as to nearly contact the wafer substrate. Additionally, apparatus 100 may include a fixing mechanism 108. Fixing mechanism 108 may be disposed vertically beneath support substrate conveyance mechanism 102 in alignment with transfer mechanism 106, at a transfer position for transferring a die to the product substrate.

Furthermore, apparatus 100 may be communicatively coupled to a computing device 110. Computing device 110 is configured to receive information and data useful in the transfer process of directly transferring die from a wafer tape in wafer tape conveyance mechanism 104 using the transfer mechanism 106 on to a product substrate supported by the support substrate conveyance mechanism 102, whereat the die may be fixed upon the product substrate via actuation of a laser or other energy-emitting device (fixing mechanism 108). Computing device 110 may also serve as a receiver, compiler, organizer, and controller of data being relayed to and from each of wafer tape conveyance mechanism 104, support substrate conveyance mechanism 102, transfer mechanism 106, and fixing mechanism 108. Thus, computing device 110 may cause the various components of apparatus 100 to perform programmed functions. Computing device 110 may further receive directed information from a user of the apparatus 100.

Figure 2A:
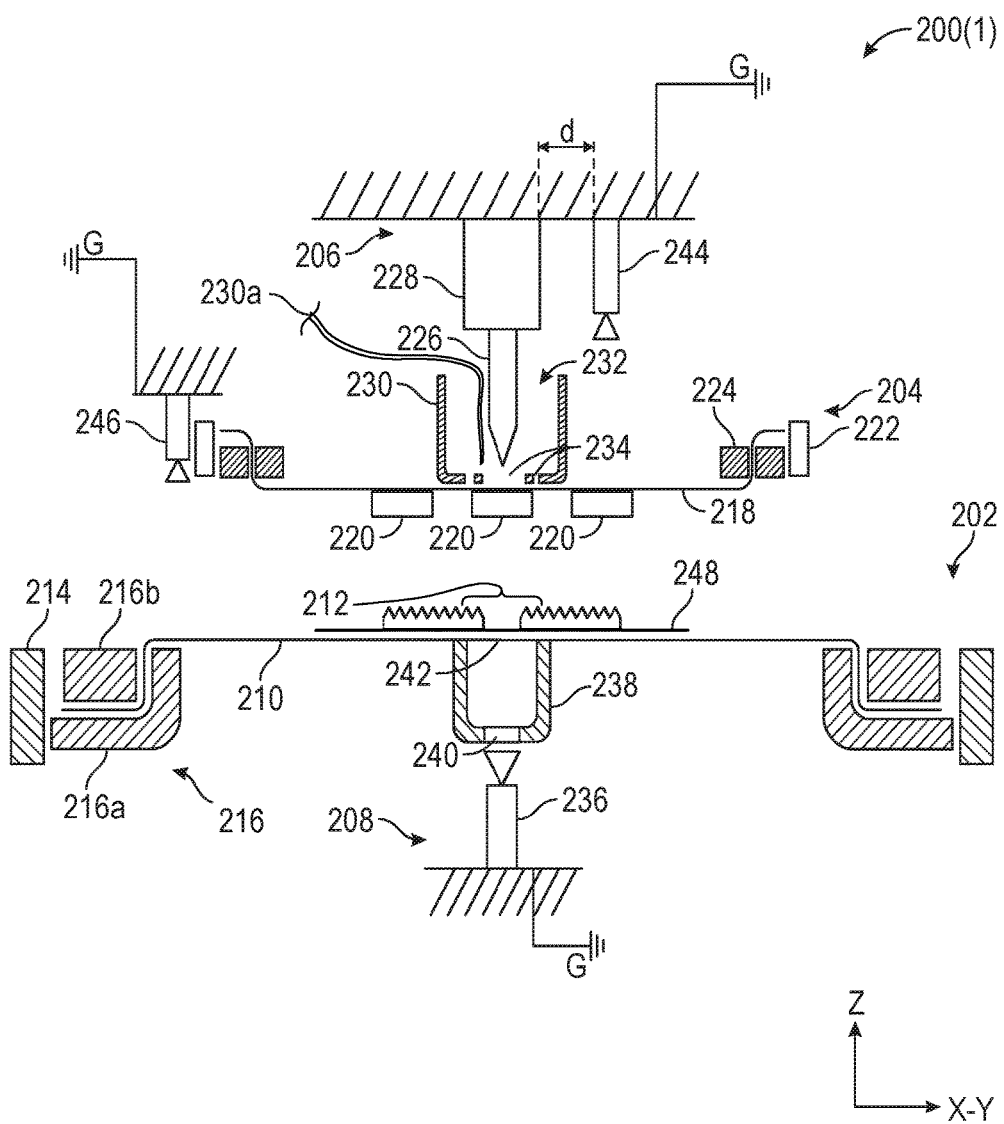
FIG. 2A represents a schematic view of an embodiment of a transfer apparatus in a pre-transfer position.
Figure 2B:
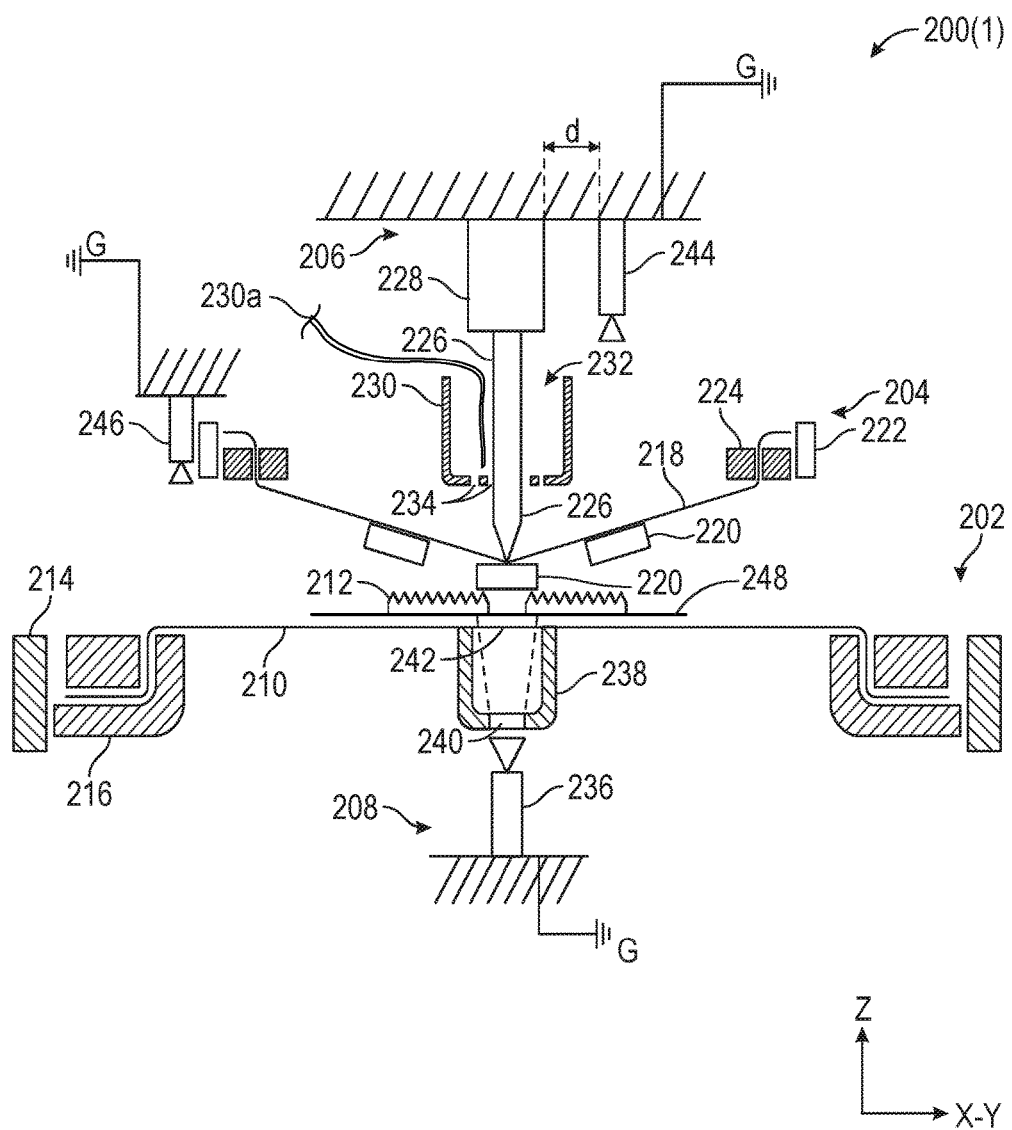
FIG. 2B represents a schematic view of an embodiment of a transfer apparatus in a transfer position.

Inasmuch as FIGS. 2A and 2B depict different stages of the transfer operation, while referring to the same elements and features of apparatus 200(1), the following discussion of specific features may refer interchangeably to either or both FIGS. 2A and 2B, except where explicitly indicated. In addition, some of the features from FIGS. 2A and 2B will be discussed later herein with reference to features similarly found in FIG. 2C.

In particular, FIGS. 2A and 2B illustrate an embodiment of an apparatus 200(1), including a support substrate conveyance mechanism 202, a wafer tape conveyance mechanism 204, a transfer mechanism 206, and a fixing mechanism 208. Support substrate conveyance mechanism 202 may be disposed adjacent to wafer tape conveyance mechanism 204. For example, as illustrated, support substrate conveyance mechanism 202 may extend in a substantially horizontal direction and may be disposed vertically beneath wafer tape conveyance mechanism 204 so as to take advantage of any effect that gravity may have in the transfer process. Alternatively, support substrate conveyance mechanism 202 may be oriented so as to extend transversely to a horizontal plane.

During a transfer operation, conveyance mechanisms 202, 204 may be positioned such that a space between a surface of a product substrate, which is carried by support substrate conveyance mechanism 202, and a surface of a wafer tape, which is carried by wafer tape conveyance mechanism 204, may be more or less than 1 mm. This space may vary depending on other aspects of apparatus 200(1), including the amount of deflection that occurs by components during the transfer process, as described herein below. In an embodiment, the respective opposing surfaces of the wafer tape and the product substrate may be the most prominent structures in comparison to the supporting structures of conveyance mechanisms 202, 204. That is, in order to avoid a collision between components of the machine and products thereon, which might be caused by movable parts (e.g., conveyance mechanisms 202, 204), a distance between the respective surfaces of the wafer tape and product substrate may be less than a distance between any other opposing structural components.

As depicted, and in some instances, transfer mechanism 206 may be disposed vertically above wafer tape conveyance mechanism 204, and fixing mechanism 208 may be disposed vertically beneath support substrate conveyance mechanism 202. It is contemplated that in some embodiments, one or both of transfer mechanism 206 and fixing mechanism 208 may be oriented with respect to each other in a manner other than that illustrated in FIGS. 2A and 2B. For instance, transfer mechanism 206 may be disposed so as to extend at an acute angle with respect to a horizontal plane. In another embodiment, fixing mechanism 208 may be oriented to emit energy during the transfer process from the same direction of actuation as transfer mechanism 206, or alternatively, from any orientation and position from which fixing mechanism 208 is able to participate in the transfer process.

Support substrate conveyance mechanism 202 may be used to secure a support substrate 210. Herein, the term "support substrate" may include, but is not limited to: a polymer substrate, where the polymer, whether translucent or otherwise, may be selected from any suitable polymers, including, but not limited to, silicone, acrylic, polyester, polycarbonate, polyimide, etc.; a cloth material of cotton, nylon, rayon, leather, etc.; or any other surface suitable for receiving and supporting a product substrate. The choice of material of support substrate 210 may also include materials that are durable, resilient, and flexible.

Support substrate 210 may be capable of withstanding repetitive and cyclic die transfer processes. In addition, support substrate 210 may be selected according to properties and/or characteristics of the product substrate and/or the die being used. That is, the support substrate may be chosen to achieve desired dampening during the transfer process. Furthermore, while varying product substrates may be used in conjunction with apparatus 200(1), support substrate 210 may be sufficiently versatile such that a single support substrate may be implemented with various die(s) and/or product substrates. That is, support substrate 210 may be selected to be universal with varying product substrates and/or die or may be selected according to each product substrate and/or die being used.

Support substrate 210 is configured to receive, support, and secure product substrate 248. Herein, the term "product substrate" may include, but is not limited to: a wafer tape (for example, to presort the die and create sorted die sheets for future use); a paper or polymer substrate formed as a sheet or other non-planar shape, where the polymer—translucent or otherwise—may be selected from any suitable polymers, including, but not limited to: silicone, acrylic, polyester, polycarbonate, polyimide, etc.; a circuit board (such as a printed circuit board (PCB)); a string or thread circuit, which may include a pair of conductive wires or "threads" extending in parallel; and a cloth material of: cotton, nylon, rayon, leather, etc. The choice of material of product substrate 248 may include durable materials, flexible materials, rigid materials, and other materials with which the transfer process is successful and which maintain suitability for the end use of product substrate 248. Product substrate 248 may also be formed solely or at least partially of conductive material such that product substrate 248 may act as a conductive circuit for forming a product. Product substrate 248 may be thinner, thicker, or the same thickness as support substrate 210. The potential types of product substrate may further include items, such as glass bottles, vehicle windows, or sheets of glass.

Product substrate 248 may be secured to support substrate 210 through a plurality of methods so as to assist in the alignment aspect of the transfer process. Product substrate 248 may be secured to support substrate 210 during the transfer process via adhesive means, such as a tape or glue. Other means of securing product substrate 248 may include: static friction, suction, fusion, mechanical means, etc. Additionally, as mentioned previously, and in an embodiment, the product substrate may be secured via a system of holes in the support substrate that align with protrusions on the product substrate. Furthermore, product substrate 248 may be either permanently or temporarily affixed to support substrate 210. Inasmuch as product substrate is either permanently or temporarily affixed, support substrate is permitted to dampen forces associated with the transfer process.

When permanently affixed to the support substrate, support substrate may reinforce product substrate, encapsulate product substrate so as to protect the product substrate and/or die, or become part of a product circuit. In cases where permanently affixed, as will be discussed herein, after transfer of the die(s), support substrate and product substrate may be removed together. Thereafter, a subsequent support substrate may be placed in the support substrate conveyance mechanism prior to the die transfer process on a subsequent product substrate.

Alternatively, in an embodiment where product substrate is temporarily attached to support substrate, after transfer of the die, product substrate may be removed from support substrate. Such removal may occur while support substrate is still secured in the machine or after support substrate and product substrate are removed from the machine together. To assist removal, conveyance mechanism(s) 202 and/or 204 may be maneuvered. Separation of product substrate from support substrate may involve whatever means required. Once removed and separated, a subsequent product substrate may be secured to the support substrate for additional transfer processes. That is, as mentioned previously, support substrate may be reusable and configured to support various product substrates.

Note that while product substrate 248 is shown as being elevated above an opposing surface of support substrate 210, separated by a gap, the depicted gap is only for illustration purposes to illustrate the alignment and positioning of support substrate 210 and product substrate 248 as distinct components. That is, during the transfer process, opposing surfaces of support substrate 210 and product substrate 248 may be flush with each other. Additionally, and/or alternatively, in some instances, the product substrate may be secured to the support substrate via one or more points of contact, such that a gap (air gap), may exist between a portion of the support substrate and the product substrate (not shown).

As previously mentioned, support substrate 210 may be configured to support product substrate 248 during and when product substrate 248 receives die 220. More particularly, it is contemplated that product substrate 248 and/or die 220 may be susceptible to damage during the transfer process. Accordingly, a suitable support substrate 210 may be selected based on the product substrate and/or die being transferred. Such support substrate may serve to dampen the force of the transfer to permit die 220 to be transferred onto product substrate 248 without any or significant damage.

For instance, in an embodiment where product substrate 248 and/or die 220 is fragile or rigid (e.g. given the "unpackaged" nature of the die), a flexible support substrate may be selected. When transferring the die(s), the flexible support substrate may allow downward deflection so as to dampen the forces associated with the transfer process. In turn, the flexible support substrate may prevent these forces from being introduced to die 220 and/or product substrate 248.

In another embodiment, support substrate 210 may be chosen to reinforce a thin product substrate that may otherwise bend, deform, or puncture without reinforcement during the transfer process. Correspondingly, in both above instances, which are included for illustrations only and do not present limiting examples, support substrate 210 may help maintain the integrity and viability of die 220 and/or product substrate 248.

In an embodiment as depicted in FIGS. 2A and 2B, product substrate 248 may include a circuit trace 212 disposed thereon. Circuit trace 212, as depicted, may include a pair of adjacent trace lines spaced apart by a trace spacing, or gap so as to accommodate a distance between electrical contact terminals (not shown) on the die being transferred. Thus, the trace spacing, or gap between the adjacent trace lines of circuit trace 212 may be sized according to the size of the die being transferred to ensure proper connectivity and subsequent activation of the die. For instance, circuit trace 212 may have a trace spacing, or gap ranging from about 75 to 200 microns, about 100 to 175 microns, or about 125 to 150 microns. However, while only one conductive trace 212 is shown, it is contemplated that product substrate 248 may have a plurality of conductive traces 212 for receiving multiple die. In turn, transfer mechanism 206 may be capable of transferring die 220 on circuit trace 212 having a multiple designs, configurations, or patterns.

Circuit trace 212 may be formed from a conductive ink disposed via screen printing, inkjet printing, laser printing, manual printing, or other printing means. Further, circuit trace 212 may be pre-cured and semi-dry or dry to provide additional stability, while still being activatable for die conductivity purposes. A wet conductive ink may also be used to form circuit trace 212, or a combination of wet and dry ink may be used for circuit trace 212. Alternatively, or additionally, circuit trace 212 may be pre-formed as a wire trace, or photo-etched, or from molten material formed into a circuit pattern and subsequently adhered, embedded, or otherwise secured to product substrate 248.

The material of circuit trace 212 may include, but is not limited to, silver, copper, gold, carbon, conductive polymers, etc. In some instances, circuit trace 212 may include a silver-coated copper particle. A thickness of circuit trace 212 may vary depending on the type of material used, the intended function and appropriate strength or flexibility to achieve that function, the energy capacity, the size of the LED, etc. For example, a thickness of the circuit trace may range from about 5 microns to 20 microns, from about 7 microns to 15 microns, or from about 10 microns to 12 microns.

Accordingly, in a non-limiting example, product substrate 248 may be a flexible, translucent polyester sheet having a desired circuit pattern screen printed thereon using a silver-based conductive ink material to form the circuit trace 212.

Support substrate conveyance mechanism 202 may include a support substrate conveyor frame 214 for securing a support substrate holder frame 216. The structure of support substrate holder frame 216 may vary significantly depending on the type and properties (e.g., shape, size, elasticity, etc.) of support substrate 210 and/or product substrate 248 being used. In an embodiment, insofar as support substrate 210 and/or product substrate 248 may include a flexible material, support substrate 210 may be held under tension in support substrate holder frame 216, so as to create a more rigid surface upon which a transfer process, discussed herein below, is performed. Product substrate 248 may be coupled to support substrate 210 either before or after support substrate 210 is secured in frame 216.

In the above instance, the rigidity created by the tension in support substrate 210 may increase the placement accuracy when transferring components, such as die 220 on product substrate 248. For example, in an embodiment, using a durable and rigid material for the product substrate, support substrate 210 may naturally provide a firm surface to assist in placement accuracy. In contrast, when support substrate 210 is permitted to sag, wrinkles and/or other discontinuities may form in support substrate 210 and/or product substrate 248 so as to interfere with the pre-set pattern of circuit trace 212, to the extent that the transfer operation may be unsuccessful. However, despite support substrate 210 being held under tension within frame 216, support substrate 210 may still dampen forces associated with the transfer process.

While the means of securing support substrate 210 may vary greatly, FIG. 2A illustrates an embodiment of support substrate holder frame 216 including a first portion 216a having a concave shape and a second portion 216b having a convex counter shape that corresponds in shape to the concave shape. In the depicted example, tension is created for support substrate 210 by inserting an outer perimeter of support substrate 210 between first portion 216a and second portion 216b to thereby clamp support substrate 210 tightly.

Insofar as frame 216 may damage a substrate through clamping, by including support substrate 210, support substrate 210 may prevent such damage from being introduced to product substrate 248. That is, damage may be avoided to product substrate 248 due to the tensioning of support substrate 210 as secured between first and second portions 216a, 216b.

Support substrate conveyor frame 214 may be conveyed in at least three directions—two directions in the horizontal plane and one direction in the vertical plane. However, conveyance may also occur about an axis. Conveyance may be accomplished via a system of motors, rails, and gears (not shown). As such, support substrate holder frame 216 may be conveyed to and held in a specific position as directed and/or programmed and controlled by a user of apparatus 200(1).

Wafer tape conveyance mechanism 204 may be implemented to secure a wafer tape 218 having die 220 (i.e., semiconductor device die) thereon. Wafer tape 218 may be conveyed in multiple directions to the specific transfer positions for the transfer operation via a wafer tape conveyor frame 222. Similar to support substrate conveyor frame 214, wafer tape conveyor frame 222 may include a system of motors, rails, and gears (none of which are shown).

As mentioned previously, the die(s) 220 for transfer may be extremely small. Accordingly, there is a need to prevent damage to the die during the transfer process. In an embodiment, the height of die 220 may range from 12.5 to 200 microns, or from 25 to 100 microns, or from 50 to 80 microns. Due to the micro size of die 220, when wafer tape 218 has been conveyed to the appropriate transfer position, a gap spacing between wafer tape 218 and product substrate 248 may range from about 0.25 mm to 1.50 mm, or about 0.50 mm to 1.25 mm, or about 0.75 mm to 1.00 mm, for instance. A minimum gap spacing may depend on factors including: a thickness of die(s) 220 being transferred, a stiffness of wafer tape 218 involved, an amount of deflection of wafer tape 218 needed to provide adequate capture and release of die 220, a proximity of the adjacent die 220 on wafer tape 218, etc. As the distance between wafer tape 218 and product substrate 248 decreases, a speed of the transfer operation may also decrease due to the reduced cycle time (discussed further herein) of the transfer operation. Such a decrease in the duration of a transfer operation may therefore increase a rate of die transfers. For instance, in a non-limiting example, the die transfer rate may range from about 6-20 die placed per second.

In some instances, materials used for the die may include, but is not limited to, silicon carbide, gallium nitride, a coated silicon oxide, etc. Furthermore, sapphire or silicon may be used as well. Additionally, as indicated above, a "die" may be representative herein of an electrically actuatable element generally.

Furthermore, wafer tape conveyor frame 222 may secure a wafer tape holder frame 224, which may stretch and hold wafer tape 218 under tension. As illustrated in FIG. 2A, wafer tape 218 may be secured in wafer tape holder frame 224 via clamping a perimeter of wafer tape 218 between adjacent components of wafer holder frame 224. Such clamping may assist in maintaining the tension and stretched characteristic of wafer tape 218, thereby increasing the success rate and accurate placement of die 220 during the transfer operation. In view of the varying properties of different types, brands, and qualities of wafer tapes available, a particular wafer tape may be selected for use based on an ability to consistently remain at a desired tension during a transfer process. In some instances, the actuation performance profile of the transfer element may change depending on the tension of wafer tape 218 and/or to prevent damage to die 220.

The material used for wafer tape 218 may include a material having elastic properties, such as a rubber or silicone, for example. Furthermore, inasmuch as temperature of the environment during transfer and wafer tape 218 itself may contribute to potential damage to wafer tape 218 during the transfer process, a material having properties that are resistant to temperature fluctuation may be advantageous. Additionally, in some instances, wafer tape 218 may be stretched slightly so as to create a separation or gap between individual die 220 to assist in the transfer operation. A surface of wafer tape 218 may include a sticky or adhesive substance via which die 220 may be removably adhered to wafer tape 218.

Wafer tape 218 may include die 220 that were individually cut from a solid semiconductor wafer and then placed onto wafer tape 218 to secure die 220. In such a situation, the die may be pre-sorted and explicitly organized on wafer tape 218, in order, for example, to assist in the transfer operation. In particular, die 220 may be arranged sequentially as to the expected order of transfer to product substrate 248. Such pre-arrangement of die 220 on wafer tape 218 may reduce the amount of travel that would otherwise occur between conveyance mechanisms 202, 204. Additionally, or alternatively, die 220 on wafer tape 218 may have been pre-sorted to include only die 220 having substantially equivalent performance properties. In this case, efficiency of the supply chain may be increased and thus, travel time of wafer tape conveyance mechanism 204 may be reduced.

In some embodiments, wafer tape 218 may include die that are not pre-sorted, but rather are formed by simply cutting a semiconductor directly on wafer tape, and then leaving the die on the wafer tape without "picking and placing" to sort the die depending on the respective performance quality of the die. In such a situation, the die on the wafer tape may be mapped to describe the exact relative locations of the different quality die. Therefore, in some instances, it may be unnecessary to use wafer tape having pre-sorted die. In such a case, the amount of time and travel for wafer tape conveyance mechanism 204 to move between particular die for each sequential transfer operation may increase. This may be caused in part by the varying quality of the die dispersed within the area of the semiconductor, which means that a die of a specific quality for the next transfer operation may not be immediately adjacent to the previously transferred die. Thus, wafer tape conveyance mechanism 204 may move wafer tape 218 further to align an appropriate die of a specific quality for transfer than would be necessary for a wafer tape 218 containing die of substantially equivalent quality.

In further regard to die 220 on wafer tape 218, in some instances, a data map of die 220 may be provided with wafer tape 218. The data map may include a digital file providing information that describes the specific quality and location of each die 220 on wafer tape 218. The data map file may be input into a processing system in communication with apparatus 200(1), whereby apparatus 200(1) may be controlled/programmed to seek the correct die 220 on wafer tape 218 for transfer to product substrate 248.

A transfer operation is performed, in part, via transfer mechanism 206, which is a die separation device for assisting in separation of die 220 from wafer tape 218. The actuation of transfer mechanism 206 may cause one or more die 220 to be released from wafer tape 218 and to be captured by product substrate 248. As discussed above, in an embodiment, transfer mechanism 206 may operate by pressing a transfer element, such as elongated rod, a pin, or a needle 226 into a top surface of wafer tape 218 against die 220. Needle 226 may be connected to a needle actuator 228 that may include a motor connected to needle 226 to drive needle 226 toward wafer tape 218 at predetermined/programmed times.

In view of the function of needle 226, needle 226 may include a material that is sufficiently durable to withstand repetitive, rapid, minor impacts while minimizing potential harm to die 220 upon impact and as die 220 are pushed into contact with product substrate 248. For example, needle 226 may include a metal, a ceramic, a plastic, etc. Additionally, a tip of needle 226 may have a particular shape profile, such as being rounded or chamfered, which may affect the ability of the needle to function repetitively without frequently breaking either the tip or damaging wafer tape 218 or die 220.

In a transfer operation, needle 226 may be aligned with a particular die 220, as depicted in FIG. 2A, and needle actuator 228 may move needle 226 to push against an adjacent side of wafer tape 218 at a position in which die 220 is aligned on the opposing side of wafer tape 218, as depicted in FIG. 2B. The pressure from needle 226 may cause wafer tape 218 to deflect so as to extend die 220 toward a position closer to product substrate 248 than adjacent die 220, which are not being transferred. As indicated above, the amount of deflection may vary depending on several factors, such as the thickness of the die and circuit trace (e.g. a thinner circuit trace may require the wafer tape to deflect farther downward). For example, where die 220 is about 50 microns thick and circuit trace 212 is about 10 microns thick, an amount of deflection of wafer tape 218 may be about 75 microns. Thus, die 220 may be pressed via needle 226 toward product substrate 248 to the extent that the electrical contact terminals (not shown) of die 220 are able to bond with circuit trace 212, at which point, the transfer operation proceeds to completion and die 220 is released from wafer tape 218. During such operation, support substrate 210 may flex so as to dampen forces created by pressing the die 220 into contact with the contact terminals.

In addition, while the transfer process described above discusses the transfer with respect to a particular die, wafer tape 218 and needle 226 may be configured to transfer multiple die during a single transfer operation. However, to the extent that the transfer process may include a rapidly repeated set of steps including a cyclical actuation of needle 226 pressing upon die 220, a method of the process is described in detail herein below with respect to FIG. 6.

Turning attention back to FIGS. 2A and 2B, in an embodiment, transfer mechanism 206 may further include a needle retraction support 230, (also known as a pepper pot). In an embodiment, support 230 may include a structure having a hollowed space whereby needle 226 may be accommodated by passing into the space via an opening 232 in a first end of support 230. Support 230 may further include at least one opening 234 on a second opposing end of support 230. Moreover, support 230 may include multiple perforations near opening 234. The at least one opening 234 may be sized with respect to a diameter of needle 226 to accommodate passage of needle 226 therethrough so as to press on wafer tape 218 during the transfer process. In an embodiment, support 230 may be disposed adjacent to the upper surface of wafer tape 218. As such, when needle 226 is retracted from pressing on wafer tape 218 during a transfer operation, a base surface of support 230 (having the at least one opening 234 therein) may come into contact with the upper surface of wafer tape 218, thereby preventing upward deflection of wafer tape 218. This upward deflection may be caused in the event where needle 226 pierces at least partially into wafer tape 218, and while retracting, the wafer tape is stuck to the tip of needle 226. Thus, support 230 may reduce the time it takes to move to the transfer process to the next die 220.

When die 220 are transferred according to a data map, support 230 may maintain the accuracy when placing die 220 as support 230 may prevent deflection of deformation of support substrate 210 and/or product substrate 248. A wall perimeter shape of support 230 may be cylindrical or any other shape that may be accommodated in apparatus 200(1). Accordingly, support 230 may be disposed between needle 226 and an upper surface of wafer tape 218.

With respect to the effect of temperature on the integrity of wafer tape 218, it is contemplated that a temperature of support 230 may be adjusted so as to regulate the temperature of needle 226 and wafer tape 218, at least near the point of the transfer operation. Accordingly, the temperature of support 230 may be heated or cooled, and a material of support 230 may be selected to maximize thermal conductivity. For example, support 230 may be formed of aluminum, or another relatively high thermal conductivity metal or comparable material, whereby the temperature may be regulated to maintain consistent results of the transfer operations. In some instances, air may be circulated within support 230 to assist in regulating the temperature of a local portion of wafer tape 218. Additionally, or alternatively, a fiber optic cable 230a may be inserted into needle retraction support 230, and may further be against needle 226 to assist in temperature regulation of wafer tape 218 and/or needle 226.

As indicated above, fixing mechanism 208 may assist in affixing die 220 to the circuit trace 212 on a surface of product substrate 248. FIG. 2B illustrates apparatus 200(1) in a transfer stage, where die 220 is pushed/pressed against circuit trace 212 on product substrate 248. In an embodiment, fixing mechanism 208 may include an energy-emitting device 236 including, but not limited to: a laser; electromagnetic radiation; pressure vibration; ultrasonic welding; etc. In some instances, the use of pressure vibration for the energy-emitting device 236 may function by emitting a vibratory energy force so as to cause disruption of the molecules within circuit trace 212 against those of the electrical contact terminals so as to form a bond via the vibratory pressure.

In a non-limiting example, as depicted in FIG. 2B, a laser may be implemented as the energy-emitting device 236. During a transfer operation, laser 236 may be activated to emit a specific wavelength and intensity of light energy directed at die(s) 220 being transferred. The wavelength of the light of laser 236 may be selected specifically based on the absorption of that wavelength of light with respect to the material of circuit trace 212 without significantly affecting the material of support substrate 210 and/or product substrate 248. For example, in an embodiment, a laser having an operational wavelength of 808 nm, and operating at 5 W may be readily absorbed by silver of the circuit trace, but not by a polymer used in either the support substrate or the product substrate. As such, light from the laser may pass through support substrate 210 and product substrate 248 and affect the silver of circuit trace 212. Alternatively, the wavelength of light may be selected based on the absorption of that wavelength of light with respect to circuit trace 212 and material of product substrate 248, while not affecting support substrate 210. Yet still, the wavelength may be chosen to affect support substrate 210. For example, in an embodiment, a specific wavelength of light may be chosen to adhere product substrate 248 to support substrate 210.

The focus area of energy-emitting device 236 (indicated by the dashed lines emanating vertically from energy-emitting device 236 in FIG. 2B toward product substrate 248) may be sized according to the size of the LED, such as for example, a 300 micron wide area.

Figure 4:
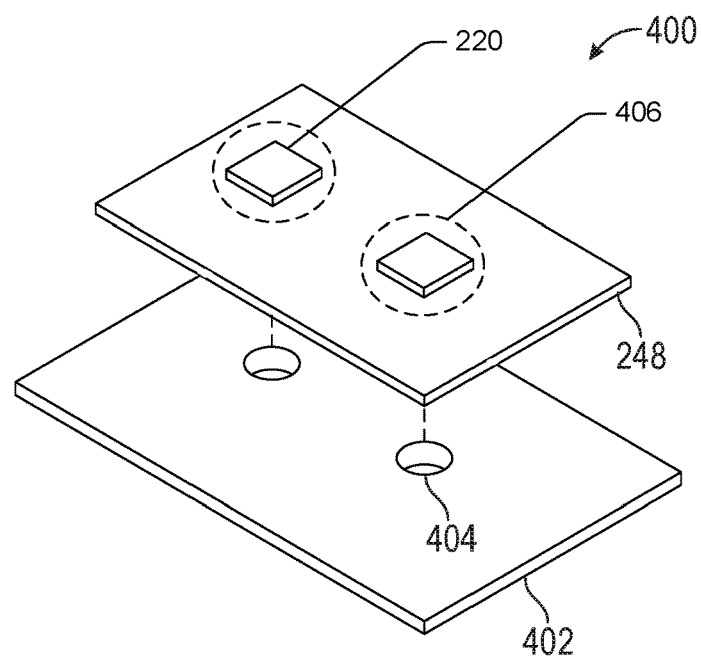
FIG. 4 illustrates an exploded perspective view of an embodiment of a support substrate and a product substrate, according to an embodiment of the instant application.

In addition, as discussed in more detail with respect to FIG. 4, support substrate 210 may have a plurality of holes that permit energy of the energy-emitting device 236 to physically pass therethrough, without being absorbed or contacting support substrate 210, such that the energy of energy-emitting device 236 directly reaches product substrate 248.

In an embodiment using a laser, upon actuation of a predetermined controlled pulse duration of laser 236, circuit trace 212 may begin to cure (and/or melt or soften) to an extent that a fusing bond may form between the material of circuit trace 212 and the electrical contact terminals (not shown) on die 220. In addition, as mentioned previously, a further bond may form between die 220 and product substrate 248, either during the same or additional pulses of the laser used to affix die 220. This further bond may assist in separating die 220 from wafer tape 218, as well as simultaneously affixing die 220 to circuit trace 212 and/or product substrate 248. These bonds may be modified and/or controlled through a different selection of material of circuit trace 212, die 220, material of product substrate 248, and/or a particular wavelength of light emitted by a laser as the energy-emitting device 236. Additionally, energy-emitting device 236 may cause some heat transfer on wafer tape 218, thereby reducing adhesion of die 220 to wafer tape 218 and thus assisting in the transfer operation.

In other instances, die may be released and fixed to the product substrate in many ways, including using a laser having a predetermined wavelength or a focused light (e.g., IR, UV, broadband/multi spectral) for heating/activating circuit traces to thereby cure an epoxy or phase change bond materials, or for deactivating/releasing a die from wafer tape, or for initiating some combination of reactions. Furthermore, a vacuum may be implemented to pull a die from the wafer tape, and/or air pressure may be implemented to push the die onto a product substrate, potentially including a rotary head between the die wafer substrate and the product substrate. In yet another instance, ultrasonic vibration may be used to cause the die to bond to the circuit traces.

Similar to needle retraction support 230, fixing mechanism 208 may also include a substrate support 238, which may be disposed between energy-emitting device 236 and a bottom surface of support substrate 210. Support 238 may include an opening 240 at a base end thereof and an opening 242 at an upper end thereof. For instance, support 238 may be formed as a ring or hollow cylinder. Energy-emitting device 236 emits the energy through openings 240, 242 to reach product substrate 248. Support 238 may also include a structure to secure a lens (not shown) to assist in directing the emitted energy from energy-emitting device 236 toward product substrate 248.

Furthermore, the upper end of the sidewalls of support 238 may be disposed in direct contact with or closely adjacent to the bottom surface of support substrate 210.

Positioned as such, support 238 may help to prevent damage from occurring to support substrate 210 and/or product substrate 248 during the stroke of needle 226 at or during the time of a transfer operation. In addition, similar to support 230, support 238 may prevent deformation of support substrate 210 and/or product substrate 248 so as to assist in accurate placement of die corresponding to a preconfigured layout (die map data).

In some instances, during the transfer operation, the portion of the bottom surface of support substrate 210 aligned with support 238 may contact support 238, which thereby provides resistance against the incoming motion of die 220 being pressed by needle 226. Moreover, support 238 may be movable in a direction of the vertical axis to be able to adjust a height thereof so as to raise and lower support 238 as necessary, including to a height of support substrate 210.

In addition to the above features, apparatus 200(1) may further include a first sensor 244, from which apparatus 200(1) receives information regarding die 220 on wafer tape 218. In order to determine which die is to be used in the transfer operation, wafer tape 218 may have a bar code (not shown) or other identifier, which is read or otherwise detected. The identifier may provide die map data to apparatus 200(1) via first sensor 244.

As shown in FIGS. 2A and 2B, first sensor 244 may be positioned near transfer mechanism 206 (or needle 226, specifically), spaced apart from transfer mechanism 206 by a distance (d), which, in some instances, may range from about 1-5 inches, so as to enhance the accuracy of location detection. In an alternative embodiment, first sensor 244 may be disposed adjacent the tip of needle 226 in order to sense the exact position of die 220 in real time. It is also contemplated that during the transfer operation or over the course of the operation, wafer tape 218 may be punctured and or stretched, which may alter the previously mapped, and thus expected, locations of die 220 on wafer tape 218. As such, small changes in the stretching of wafer tape 218 could add up to significant errors in alignment of die 220 being transferred. Thus, real time sensing may be implemented to assist in accurate die location.

In some instances, first sensor 244 may be able to identify the precise location and type of die 220 being sensed. This information may be used to provide instructions to wafer tape conveyor frame 222 indicating the exact location to which wafer tape 218 should be conveyed in order to perform the transfer operation. Sensor 244 may be one of many types of sensors, or a combination of sensor types to better perform multiple functions. For instance, sensor 244 may include, but is not limited to: a laser range finder or an optical sensor, such as a non-limiting example of a high-definition optical camera having micro photography capabilities.

Moreover, in some instances, a second sensor 246 may also be included in apparatus 200(1). Second sensor 246 may be disposed with respect to support substrate 210 or product substrate 248 so as to detect the precise position of circuit trace 212 on product substrate 248. This information may then be used to determine any positional adjustment needed to align product substrate 248 between transfer mechanism 206 and fixing mechanism 208 so that the next transfer operation occurs in the correct location on circuit trace 212. This information may further be relayed to apparatus 200(1) to coordinate conveying product substrate 248 to a correct position, while simultaneously conveying instructions to wafer tape conveyor frame 222. A variety of sensors are also contemplated for sensor 246 including optical sensors, such as one non-limiting example of a high-definition optical camera having micro photography capabilities.

FIGS. 2A and 2B further illustrate that first sensor 244, second sensor 246, and energy-emitting device 236 may be grounded. In some instances, first sensor 244, second sensor 246, and energy-emitting device 236 may all be grounded to the same ground (G), or alternatively, to a different ground (G).

Depending on the type of sensor used for first and second sensors 244, 246, first or second sensors 244, 246 may further be configured to test the functionality of transferred die. Alternatively, an additional tester sensor (not shown) may be incorporated into the structure of apparatus 200(1) to test individual die before removing product substrate 248 from apparatus 200(1).

After transferring die(s) 220, product substrate 248 may be removed from apparatus 200(1) and/or support substrate 210. Thereafter, product substrate 248 may undergo additional processing or may be incorporated into a product circuit.

Furthermore, in an embodiment, multiple independently-actuatable needles and/or lasers may be implemented in a machine to transfer and fix multiple die at a given time. The multiple needles and/or lasers may be independently movable within a three-dimensional space. Multiple die transfers may be done synchronously (multiple needles going down at the same time), or concurrently but not necessarily synchronously (e.g., one needle going down while the other is going up, which arrangement may balance better the components and minimize vibration). Control of the multiple needles and/or lasers may be coordinated to avoid collisions between the plurality of components. Moreover, in other examples, the multiple needles and/or lasers may be arranged in fixed positions relative to each other.

Second Example Embodiment of a Direct Transfer Apparatus

Figure 2C:
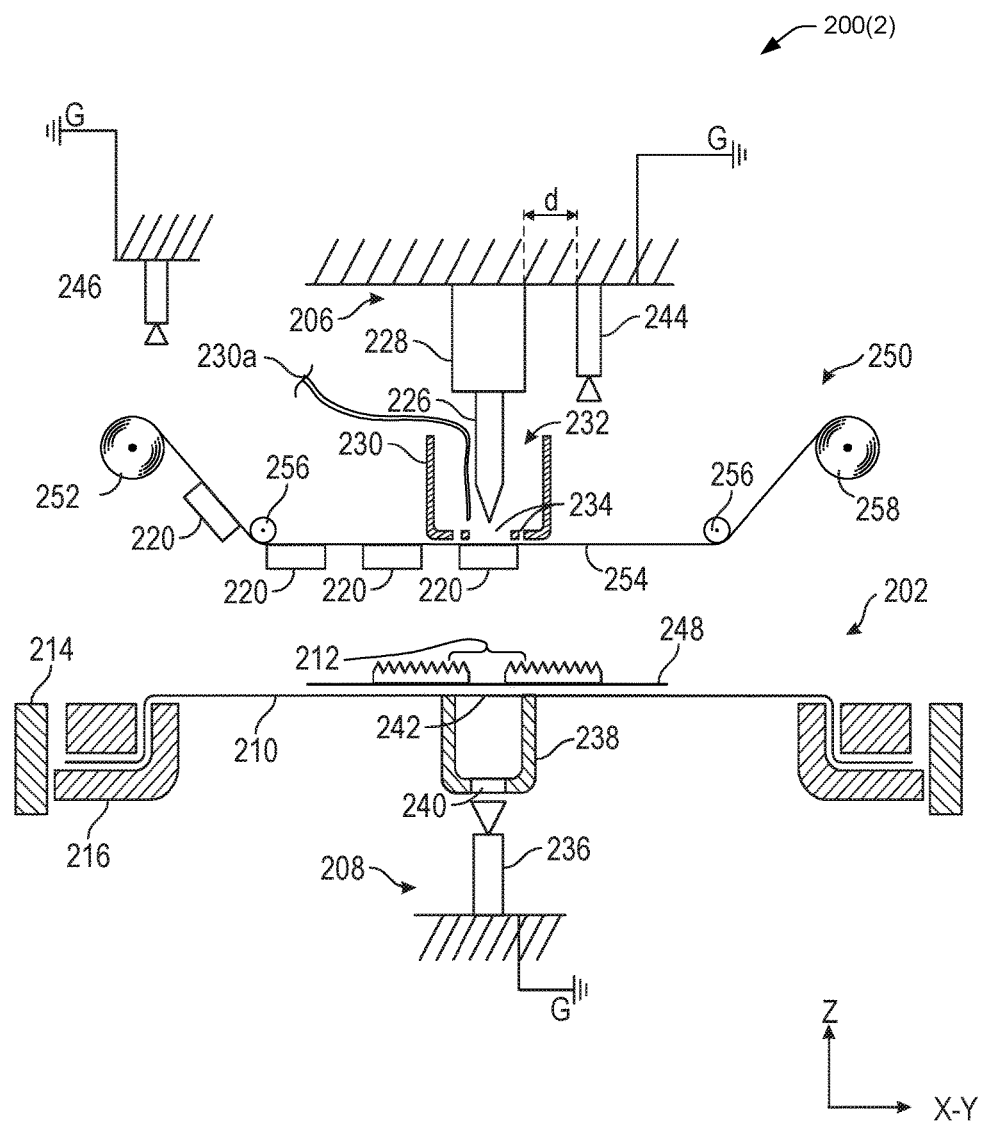
FIG. 2C illustrates a schematic view of another embodiment of a transfer apparatus in a pre-transfer position.

In an additional embodiment of a direct transfer apparatus of FIGS. 2A and 2B, as seen in FIG. 2C, apparatus 200(2) may include a wafer tape conveyance mechanism 250. In particular, in lieu of wafer tape conveyor frame 222 and tensioner frame 224 shown in FIGS. 2A and 2B, wafer tape conveyance mechanism 250 may include a system of one or more reels 252 to convey die 220 through the transfer position of apparatus 200(2) to transfer die to a substrate. In particular, each reel 252 may include a substrate 254 formed as a narrow, continuous, elongated strip having die 220 attached consecutively along the length of the strip.

In the case where a single reel 252 is used, a transfer operation may include conveying product substrate 248, via support substrate conveyance mechanism 202 as described above, using motors, tracks, and gears. However, wafer tape conveyance mechanism 250 may include a substantially static mechanism, in that, while die 220 may be fed continuously through the transfer position by unrolling substrate 254 from reel 252, reel 252 itself main remain in a fixed position. In some instances, the tension of substrate 254 may be maintained for stability purposes by tensioning rollers 256, and/or a tensioning reel 258, which may be disposed on a side of apparatus 200(2) opposite reel 252. Tensioning reel 258 may roll up substrate 254 after die 220 have been transferred to product substrate 248. Alternatively, the tension may be maintained by any other suitable means to secure substrate 254 so as to assist in pulling it through the transfer position after each transfer operation to cycle through die 220.

In an embodiment where multiple reels 252 are used, each reel 252 may be disposed laterally adjacent to other reels 252. Each reel 252 may be paired with a specific transfer mechanism 206 and a specific fixing mechanism 208. In this case, each respective set of transfer mechanisms and fixing mechanisms may be arranged with respect to product substrate 248 such that multiple die may be placed in multiple locations on the same product substrate 248 simultaneously. For instance, in some instances, the respective transfer positions (i.e., the alignment between a transfer mechanism and a corresponding fixing mechanism) may be in a line, offset, or staggered so as to accommodate various circuit trace patterns. Note that in an embodiment with a plurality of reels 252, a circuit trace pattern may be such that not every transfer mechanism may need to be actuated simultaneously. Accordingly, multiple transfer mechanisms may be actuated intermittently as the product substrate is conveyed to various positions for transfer.

Whether one reel 252 or a plurality of reels 252 are implemented, the die transfer operation may be relatively similar to the transfer operation as described above with respect to the first example embodiment of the direct transfer apparatus 200(1) in FIGS. 2A and 2B. For instance, product substrate 248 may be conveyed to a transfer position (die fixing position) in the same manner as described above via support substrate conveyance mechanism 202, transfer mechanism(s) 206 may perform a needle stroke to transfer die 220 from die substrate 254 to product substrate 248, and fixing mechanism 208 may be actuated to assist in affixing die 220 to product substrate 248.

Example Product Substrate

Figure 3:
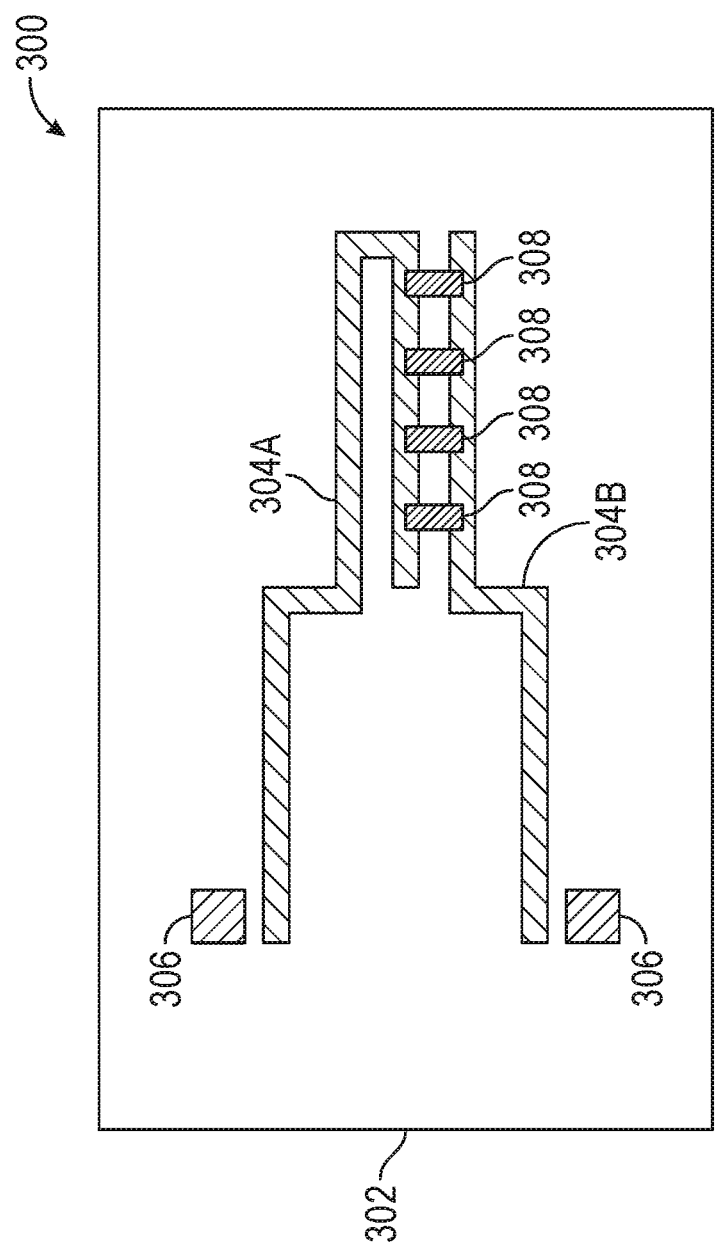
FIG. 3 illustrates a plan view of an embodiment of a product substrate having a circuit trace with semiconductor die thereon.

FIG. 3 illustrates an example embodiment of a processed product substrate 300. A product substrate 302 may include a first portion of a circuit trace 304A, which may perform as a negative or positive power terminal when power is applied thereto. A second portion of circuit trace 304B may extend adjacent to first portion of circuit trace 304A, and may act as a corresponding positive or negative power terminal when power is applied thereto.

As similarly described above with respect to the wafer tape, to determine where to convey product substrate 302 to perform the transfer operation, product substrate 302 may have a bar code (not shown) or other identifier, which is read or otherwise detected. The identifier may provide circuit trace data to the apparatus, for instance, apparatus 200(1).

Product substrate 302 may further include datum points 306 that act as visual indicators for sensing by the product substrate sensor (for example, second sensor 246 in FIG. 2) to locate the first and second portions of circuit trace 304A, 304B. Once datum points 306 are sensed, a shape and relative position of the first and second portions of circuit trace 304A, 304B with respect to datum points 306 may be determined based on preprogrammed information. Using the sensed information in connection with the preprogrammed information, support substrate conveyance mechanism 202 may convey product substrate 302, via support substrate 210, to the proper alignment position for the transfer operation.

Additionally, die 308 are depicted in FIG. 3 as straddling between the first and second portions of circuit trace 304A, 304B. In this manner, the electrical contact terminals (not shown) of die 308 may be bonded to product substrate 302 during a transfer operation. Accordingly, power may be applied to run between the first and second portions of circuit trace 304A, 304B, thereby powering die 308. For example, the die may be unpackaged LEDs that were directly transferred from a wafer tape to the circuit trace on product substrate 302. Thereafter, product substrate 302 may be processed for completion of product substrate 302 and used in a circuit or other final product. Further, other components of a circuit may be added by the same or other means of transfer to create a complete circuit, and may include control logic to control LEDs as one or more groups in some static or programmable or adaptable fashion.

Example of a Support Substrate

FIG. 4 illustrates a support substrate 400 used during the transfer of die 220 onto product substrate 248. Support substrate 400 is configured according to a custom configuration prior to transferring die to a product substrate. Note, the depiction of product substrate 248 as separated (i.e. not attached) from support substrate 402 is shown for purposes of discussion of the features of FIG. 4. However, it is understood that during the process of transferring die 220, support substrate 210 physically supports product substrate 248.

In an embodiment as depicted, support substrate 402 may have a plurality of holes 404. While holes 404 are shown at certain locations, corresponding to a particular configuration, it is contemplated that the holes 404 may be arranged in any manner to correspond to a placement of die 220 on product substrate 248 (via a die data map).

As indicated above, the plurality of holes 404 may be located in support substrate 402 to align with a respective portion of product substrate 248 and/or circuit trace 212 (not shown) where die 220 are to be placed. Energy from energy-emitting device 236 may affect area 406 and condition product substrate 248 and/or circuit trace 212 to receive a die 220. Thus, holes 404 are positioned to allow energy from energy-emitting device 236 (not shown) to pass therethrough and directly reach respective portions of product substrate 248 to assist in transferring die 220 onto product substrate 248. Note that holes in the support substrate do not significantly affect the integrity of the support substrate or the ability to adequately support a product substrate.

Furthermore, while FIG. 4 illustrates support substrate 402 having holes 404, consistent with the previous description of the flexible support substrate, the support substrate may have a continuous surface, and therefore, have no holes. In such an embodiment, and as discussed, the energy from the energy-emitting device may pass through the material of the support substrate and affect the corresponding portion of product substrate 248 as indicated by area 406 and/or the circuit trace to affix die to the product substrate.

Another Example of a Support Substrate

Figure 5:
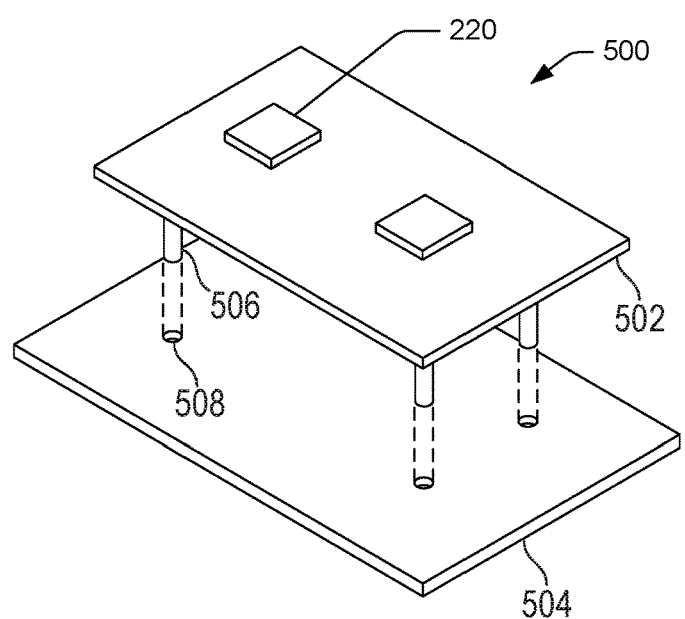
FIG. 5 illustrates an exploded perspective view of an embodiment of a support substrate and a product substrate, according to an embodiment of the instant application.

FIG. 5 illustrates a perspective view 500 of an embodiment of a product substrate 502 and a support substrate 504. The depiction of product substrate 502 as being separated from support substrate 504 is shown for purposes of discussion of the features of FIG. 5. Accordingly, during the process of transferring die 220, product substrate 502 and support substrate 504 are in contact.

As mentioned above, product substrate 502 may include one or more protrusions 506 that extend from a lower surface of product substrate 502. In an embodiment, a user may determine which product substrate 502 is involved in the transfer process and select a support substrate 504 that includes holes 508 arranged within support substrate 504 that correspond in pattern/location to the pattern/location of protrusions 506 on product substrate 502. Protrusions 506 may then be aligned with holes 508 to secure product substrate 502 to support substrate 504 during the transfer process.

While protrusions 506, and their corresponding holes 508, are shown as a particular shape, any shape may be used (e.g.

square, hexagonal, etc.). In addition, any pattern or configuration of protrusions 506 and holes 508 may be implemented. Furthermore, protrusions 506 may be longer than, equal to, or shorter than a thickness dimension of support substrate 504. Alternatively, in an embodiment (not shown), the system of protrusions 506 and holes 508 may be switched such that the protrusions are located on the support substrate and the corresponding holes are located on the product substrate.

Example Direct Transfer Method

Figure 6:
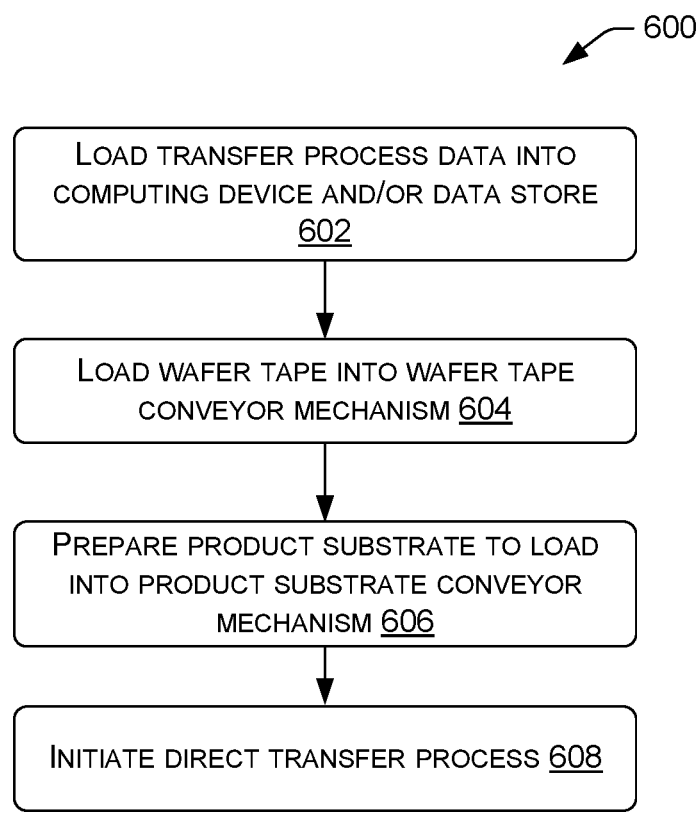
FIG. 6 illustrates a method of a die transfer process according to an embodiment of the instant application.

A method 600 of executing a direct transfer process, in which one or more die is directly transferred from a wafer tape to a product substrate, is illustrated in FIG. 6. The steps of method 600 described herein may not be in any particular order, and as such, may be executed in any satisfactory order to achieve a desired product state or ultimate circuitry.

Method 600 may include a step of loading transfer process data into a PC and/or a data store 602. The transfer process data may include data such as die map data, circuit CAD files data, and needle data. A step of loading a wafer tape into a wafer tape conveyor mechanism may also be included in method 600. Loading the wafer tape into the wafer tape conveyor mechanism may include controlling the wafer tape conveyor mechanism to move to a load position, which is also known as an extract position. The wafer tape may accordingly be secured in the wafer tape conveyor mechanism in the load position.

The wafer tape may be loaded so that the die are facing downward toward the product substrate, which may be located within the support substrate conveyor mechanism so as to be positioned on the support substrate. The product substrate may be loaded such that the circuit trace faces toward the die on the wafer. In some instances, the product substrate may be positioned on the support substrate before the support substrate is placed into the support substrate conveyance mechanism.

Method 600 may further include a step of preparing the product substrate to be placed onto the support substrate. Preparing the product substrate may include securing the product substrate to the support substrate such that the product substrate does not reposition while transferring die(s) to product substrate. In addition, preparing the product substrate may include a step of printing a circuit trace on the product substrate according to the pattern of the CAD files being loaded into the PC or data store. Similarly, datum points may be printed onto the circuit substrate in order to assist in the transfer process.

To place die, the support substrate conveyor mechanism may be controlled to move to a load position, which is also known as an extraction position, whereat the support substrate may be loaded into the support substrate conveyor mechanism. In some instances, the product substrate may be delivered and placed in the load position by a conveyor (not shown) or other automated mechanism, such as in the style of an assembly line. Alternatively, the product substrate may be manually loaded and applied to the support substrate by an operator.

Once the product substrate is properly loaded within the support substrate conveyor mechanism and the wafer tape is properly loaded into the wafer tape conveyor mechanism, a program to control the direct transfer of the die from the wafer tape to the circuit trace of the product substrate may be executed via the PC to commence the direct transfer operation 608.

CONCLUSION

Although several embodiments have been described in language specific to structural features and/or methodological acts, it is to be understood that the claims are not necessarily limited to the specific features or acts described. Rather, the specific features and acts are disclosed as illustrative forms of implementing the claimed subject matter. Furthermore, the use of the term "may" herein is used to indicate the possibility of certain features being used in one or more various embodiments, but not necessarily in all embodiments.

What is claimed is:

1. An apparatus for transferring a semiconductor die from a wafer tape to a product substrate, the apparatus comprising:
   a wafer frame configured to secure the wafer tape;
   a support frame configured to secure a support substrate having a plurality of holes, the support substrate configured to secure the product substrate; and
   an actuator configured to transfer the semiconductor die to a transfer location on the product substrate.

2. The apparatus according to claim 1, further comprising a controller communicatively coupled to the wafer frame and the support frame, the controller including memory having instructions, which when executed, cause the controller to perform operations comprising:
   orienting the wafer frame such that the semiconductor die is aligned with the transfer location,
   orienting the support frame such that the product substrate is aligned with the transfer location, and
   causing the actuator to transfer the semiconductor die at the transfer location.

3. The apparatus according to claim 1, further comprising:
   a first sensor configured to sense a location of the semiconductor die with respect to the transfer location; and
   a second sensor configured to sense a location of the product substrate with respect to the transfer location.

4. The apparatus according to claim 1, wherein at least one hole of the plurality of holes aligns with the transfer location.

5. The apparatus according to claim 1, wherein the plurality of holes is a first plurality of holes,
   wherein the support substrate includes a second plurality of holes,
   wherein the product substrate includes a plurality of protrusions, and
   wherein the product substrate is securable to the support substrate via the plurality of protrusions aligning with respective holes of the second plurality of holes.

6. The apparatus according to claim 1, wherein the support substrate further includes a plurality of protrusions,
   wherein the product substrate includes a plurality of holes, and
   wherein the product substrate is securable to the support substrate via the plurality of holes in the product substrate aligning with respective protrusions of the plurality of protrusions on the support substrate.

7. The apparatus according to claim 1, wherein the product substrate includes a plurality of protrusions, and
   wherein one or more protrusions of the plurality of protrusions on the product substrate are configured to align with one or more holes, respectively, of the plurality of holes in the support substrate.

8. The apparatus according to claim 1, wherein the actuator is configured to transfer, simultaneously, a plurality of semiconductor die to respective transfer locations on the product substrate.

9. An apparatus to affix semiconductor die to respective transfer locations on a product substrate, the apparatus comprising:

a support substrate frame to secure a support substrate, the support substrate having a plurality of holes corresponding to the respective transfer locations of the semiconductor die on the product substrate, the product substrate being securable to the support substrate;

a die substrate frame to secure a die substrate including the semiconductor die thereon; and a die separation device to separate the semiconductor die from the die substrate and transfer the semiconductor die to the respective transfer locations of the semiconductor die on the product substrate.

10. The apparatus according to claim 9, wherein the die separation device affixes the semiconductor die to a circuit trace on the product substrate.

11. The apparatus according to claim 9, wherein the die separation device is configured to transfer at least two semiconductor die to the product substrate during a single actuation of the die separation device.

12. The apparatus according to claim 9, wherein the die substrate frame and the support substrate frame are movable independently of each other and simultaneously.

13. The apparatus according to claim 9, wherein one or more material characteristics of the support substrate is based at least in part on one or more structural characteristics of the semiconductor die.

14. The apparatus according to claim 9, wherein the product substrate includes at least one protrusion, and wherein the at least one protrusion aligns with at least one hole of the plurality of holes in the support substrate when secured thereto.

15. The apparatus according to claim 9, wherein the product substrate is removably attached to the support substrate.

* * * * *